(12) United States Patent
Yamazaki et al.

(10) Patent No.: US 8,283,862 B2
(45) Date of Patent: Oct. 9, 2012

(54) LIGHT EMITTING DEVICE AND METHOD FOR MANUFACTURING THE SAME

(75) Inventors: Shunpei Yamazaki, Setagaya (JP); Junichiro Sakata, Atsugi (JP); Takashi Hamada, Atsugi (JP); Masaharu Nagai, Atsugi (JP); Yutaka Matsuda, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/905,568

(22) Filed: Oct. 15, 2010

(65) Prior Publication Data

US 2011/0027920 A1     Feb. 3, 2011

Related U.S. Application Data

(62) Division of application No. 10/933,507, filed on Sep. 3, 2004, now Pat. No. 7,816,863.

(30) Foreign Application Priority Data

Sep. 12, 2003   (JP) .................................. 2003-322223

(51) Int. Cl.
*H05B 33/22* (2006.01)
(52) U.S. Cl. ........................................ 313/507; 313/504
(58) Field of Classification Search .......... 313/498–512; 315/169.3; 345/36, 45, 76
See application file for complete search history.

(56) References Cited

U.S. PATENT DOCUMENTS

| | | | |
|---|---|---|---|
| 5,837,391 A | 11/1998 | Utsugi | |
| 6,111,274 A * | 8/2000 | Arai | ................................ 257/96 |
| 6,232,658 B1 | 5/2001 | Catabay et al. | |
| 6,399,478 B2 | 6/2002 | Matsubara et al. | |
| 6,724,150 B2 | 4/2004 | Maruyama et al. | |
| 6,781,148 B2 | 8/2004 | Kubota et al. | |
| 6,809,339 B2 | 10/2004 | Suzawa et al. | |

(Continued)

FOREIGN PATENT DOCUMENTS

CN           1310480           8/2001

(Continued)

OTHER PUBLICATIONS

Office Action (Application No. 200410078496.0) dated Apr. 4, 2008.

*Primary Examiner* — Nimeshkumar Patel
*Assistant Examiner* — Christopher Raabe
(74) *Attorney, Agent, or Firm* — Eric J. Robinson; Robinson Intellectual Property Law Office, P.C.

(57) ABSTRACT

An object of the present invention is to realize a light emitting device having low power consumption and high stability, in addition to improve extraction efficiency of light generated in a light emitting element. At least an interlayer insulating film (including a planarizing film), an anode, and a bank covering an edge portion of the anode contain chemically and physically stable silicon oxide, or are made of a material containing silicon oxide as its main component in order to accomplish a light emitting device having high stability. Generation of heat in a light emitting panel can be suppressed in addition to increase in efficiency (luminance/current) of a light emitting panel according to the structure of the present invention. Consequently, synergistic effect on reliability of a light emitting device is obtained.

16 Claims, 12 Drawing Sheets

U.S. PATENT DOCUMENTS

| | | |
|---|---|---|
| 6,828,725 B2 | 12/2004 | Kimura |
| 6,833,560 B2 | 12/2004 | Konuma et al. |
| 7,132,693 B2 | 11/2006 | Konuma et al. |
| 7,294,517 B2 | 11/2007 | Takayama et al. |
| 7,339,317 B2 | 3/2008 | Yamazaki |
| 7,602,385 B2 | 10/2009 | Kurokawa et al. |
| 7,732,824 B2 | 6/2010 | Konuma et al. |
| 2001/0045565 A1* | 11/2001 | Yamazaki ............... 257/89 |
| 2002/0158568 A1* | 10/2002 | Satake ..................... 313/493 |
| 2005/0184652 A1 | 8/2005 | Maruyama et al. |

FOREIGN PATENT DOCUMENTS

| | | |
|---|---|---|
| EP | 1 128 436 | 8/2001 |
| EP | 1 376 713 | 1/2004 |
| JP | 08-096963 | 4/1996 |
| JP | 08-330072 | 12/1996 |
| JP | 10-335066 A | 12/1998 |
| JP | 2000-012234 | 1/2000 |
| JP | 2001-176674 A | 6/2001 |
| JP | 2001-313338 | 11/2001 |
| JP | 2002-100474 A | 4/2002 |
| JP | 2002-222691 | 8/2002 |
| JP | 2002-229482 | 8/2002 |
| JP | 2002-305076 | 10/2002 |
| JP | 2002-313582 | 10/2002 |
| JP | 2002-352950 | 12/2002 |
| JP | 2003-229280 | 8/2003 |
| JP | 2003-248469 | 9/2003 |
| JP | 2003-257622 A | 9/2003 |

* cited by examiner terminal portion | pixel portion

LIGHT EMITTING DEVICE AND METHOD FOR MANUFACTURING THE SAME

BACKGROUND OF THE INVENTION

1. Field of the Invention

The present invention relates to a semiconductor device having a circuit composed of a thin film transistor (hereinafter referred to as a TFT), and to a method for manufacturing the same. For example, the invention relates to an electronic device which mounts a light emitting display device having a TFT and an organic light emitting element as its component.

In this specification, the term "semiconductor device" refers to a device in general that utilizes semiconductor characteristics to function, and electro-optical devices, semiconductor circuits, and electronic devices are all included in the semiconductor device.

2. Related Art

In these years, research on a light emitting device having an EL element as a self-luminous light emitting element is activated. The light emitting device is also referred to as an organic EL display or an organic light emitting diode. Since these light emitting devices have characteristics such as high response speed that is suitable for movie display, low voltage, and low power consumption driving, they attracts an attention for a next generation display including new generation's cellular phone and personal digital assistant (PDA).

An EL element using a layer containing an organic compound as a light emitting layer has a structure in which a layer containing an organic compound (hereinafter referred to as an EL layer) is interposed between an anode and a cathode. Electro luminescence is generated in the EL layer by applying an electric field to the anode and the cathode. Luminescence obtained from the EL element includes luminescence generated in returning to a ground state from a singlet excited state (fluorescence) and luminescence generated in returning to a ground state from a triplet excited state (phosphorescence).

However, sufficient luminance is not obtained in a conventional light emitting element using a layer containing an organic compound as a light emitting layer.

Light generated in an EL layer is extracted, regarding an anode side or a cathode side as a display surface. On this occasion, light is partly reflected at an interface among different material layers while passing through various material layers and a substrate. As a result, there is a problem that initial emission of light to be transmitted to outside of an element is reduced by several tens percent and luminance is kept low.

Thus, Reference 1 and Reference 2 by the present applicant propose an element structure for improving light extraction efficiency (Reference 1: Japanese Patent Laid-Open No. 2002-352950, and Reference 2: Japanese Patent Laid-Open No. 2002-229482).

Since luminous efficiency is low in the conventional light emitting element using a layer containing an organic compound as a light emitting element, the amount of current for obtaining desired luminance increases and power consumption also increases. Increase in power consumption greatly affects an element life, typically, shortens a half-life time of luminance. Therefore, the conventional light emitting element using a layer containing an organic compound has a problem that needs to be solved regarding element stability.

BRIEF SUMMARY OF THE INVENTION

It is an object of the present invention to provide a light emitting device having high luminance with high luminous efficiency (light extraction efficiency), low power consumption, and high stability.

According to the present invention, at least an interlayer insulating film (including a planarizing film), an anode, and a bank covering an edge portion of the anode include chemically and physically stable silicon oxide, or they are made of a material containing silicon oxide as its main component in order to accomplish a light emitting device having high stability.

Specifically, it is preferable to use a highly thermostable planarizing film obtained by application as an interlayer insulating film and a bank. An application film using a material in which a skeletal structure is configured by a bond of silicon (Si) and oxygen (O), and which contains at least one kind of hydrogen, fluorine, an alkyl group, and aromatic hydrocarbon as a substituent is used as a material of the interlayer insulating film and the bank. A baked film can be referred to as a SiOx film including an alkyl group. The SiOx film including an alkyl group has higher light transmitting property than that of an acrylic resin, and can withstand heat treatment of 300° C. or more.

According to the present invention, as for a method for forming an interlayer insulating film and a bank by application, thinner pre-wet treatment is performed to improve wettability after performing washing with purified water. Then, a liquid material referred to as varnish in which a low molecular weight component (a precursor) having a bond of silicon (Si) and oxygen (O) is dissolved into a solvent is applied over the substrate by spin coating or the like. Thereafter, a thin film can be obtained by proceeding volatilization (evaporation) of the solvent and cross-linking reaction of the low molecular weight component by heating the varnish together with the substrate. Then, an application film on the periphery of an end face of the substrate over which the application film is formed is removed. In the case of forming the bank, the application film may be patterned to have a desired shape. In addition, a film thickness is controlled by the number of spin rotation, rotational time, and concentration and viscosity of the varnish.

Manufacturing costs can be reduced by using the same material for the interlayer insulating film and the bank. In addition, cost reduction can be achieved by commonality of an apparatus such as an application film formation apparatus or an etching apparatus.

Generally, ITO (indium tin oxide) is used for an anode in an EL element using a layer containing an organic compound as a light emitting layer. However, ITO has a high refractive index of approximately 2. Therefore, indium tin oxide containing silicon oxide (hereinafter referred to as "ITSO") is used as an anode in the present invention. ITSO is not crystallized even by baking, unlike in the case of ITO, and it remains amorphous. Therefore, ITSO is suitable for an anode of a light emitting element since it has higher planarity than that of ITO and is hard to cause a short circuit with a cathode even when a layer containing an organic compound is thin. In addition, a refractive index of ITSO to be an anode is changed by making ITSO contain silicon oxide having a refractive index of approximately 1.46.

Additionally, efficiency (luminance/current) of a light emitting panel using ITSO as an anode is 1.5 times higher than that of a light emitting panel using ITO as an anode, as shown in FIG. 6. FIG. 6 shows comparison in an active matrix light emitting panel using a TFT. Current used for calculating efficiency corresponds to the total current value that is inputted to a panel.

As shown in FIGS. 12A and 12B, generation of heat is suppressed in a light emitting panel (corresponding to a sample B in FIGS. 12A and 12B) which uses a highly thermostable planarizing film using ITSO as an anode and being obtained by application as an interlayer insulating film. Consequently, reliability of a light emitting device is improved.

Namely, generation of heat in a light emitting panel can be suppressed in addition to increase in efficiency (luminance/current) of a light emitting panel according to the structure of the present invention. Consequently, synergistic effect on reliability of a light emitting device is obtained.

An electroluminescent device according to the present invention increases luminous efficiency by making a laminate through which light generated in a light emitting layer passes when it is transmitted to outside of a substrate with a highly light transmitting material and by suppressing reflection among layers having different refraction indexes. Specifically, it is effective to set a refractive index or a film thickness of an interlayer insulating film through which light passes in the case of an active matrix light emitting device using a TFT, since a laminate of a plurality of material layers is used as the interlayer insulating film. In the present invention, a refractive index or a film thickness of each layer is determined within an adjustable range in accordance with Snell's law, and light reflection at an interface of the layer is suppressed. The Snell's law means that, assuming that light enters a film having a refractive index of $n_j$ at an angle of $\theta_j$ from a film having a refractive index of $n_i$ and is transmitted at an angle of $\theta_j$ ($n_i \cdot \sin \theta_i = n_j \cdot \sin \theta_j$), all rays of light are reflected through a path symmetrical to a normal line in the case of exceeding a value of $\theta_j$ (critical angle) under a total reflection condition ($\theta_j = 90°$ in the Snell's law).

In addition, light emitted from a light emitting element is reflected or diffused in various directions and is absorbed by various portions (material layer). In the present invention, a portion through which emitted light does not pass when it is transmitted to outside of a substrate, for example, a bank is made of a material having high transmittance and absorption of light in the portion is suppressed. Accordingly, luminous efficiency is increased.

A structure of the present invention disclosed in this specification is a light emitting device comprising a plurality of light emitting elements having a cathode, a layer containing an organic compound, and an anode, wherein a highly thermostable planarizing film containing SiOx is formed over a substrate having an insulating surface, an anode containing SiOx and a bank containing SiOx covering an edge portion of the anode are formed over the highly thermo stable planarizing film, a layer containing an organic compound is formed over the anode, and a cathode is formed over the layer containing an organic compound.

In the above structure, the highly thermostable planarizing film and the bank are made of the same material, and are SiOx films including an alkyl group. In addition, in the above structure, the anode is indium tin oxide containing SiOx. Further, a TFT using the highly thermostable planarizing film containing SiOx as an interlayer insulating film is electrically connected to the anode.

Another structure of the present invention is a light emitting device comprising a plurality of light emitting elements having a cathode, a layer containing an organic compound, and an anode, wherein light emitted from a light emitting element passes through an anode containing SiOx, a highly thermostable planarizing film containing SiOx, and a substrate having an insulating surface in a light emitting region.

In each of the above structures, the light emitting element emits red, green, blue, or white light.

One structure of the present invention for realizing the above structure is a method for manufacturing a light emitting device having a thin film transistor and a light emitting element over a substrate having an insulating surface, comprising the steps of: forming a thin film transistor including a semiconductor layer having a source region, a drain region, and a channel formation region therebetween, a gate insulating film, and a gate electrode over a first substrate having an insulating surface; forming a highly thermostable planarizing film over an uneven shape reflected by the thin film transistor; forming an opening portion which has a tapered shape on a side face and is located over the source region or the drain region, and a peripheral portion having a tapered shape by selectively removing the highly thermostable planarizing film; forming a contact hole which reaches the source region or the drain region by selectively removing the gate insulating film; forming an electrode which reaches the source region or the drain region; forming an anode containing SiOx to be in contact with the electrode; forming a bank covering an edge portion of the anode; forming a layer containing an organic compound over the anode; forming a cathode over the layer containing an organic compound; and sealing the light emitting element by attaching a second substrate to the first substrate with a sealant surrounding a circumference of the light emitting element.

In the above structure, the highly thermostable planarizing film or the bank is a SiOx film including an alkyl group formed by application. In each of the above structures, the anode is formed by sputtering using a target made of indium tin oxide containing SiOx.

In each of the above structures, the light emitting device is applicable to both an active matrix type and a passive matrix type.

Each layer (the interlayer insulating film, the base insulating film, the gate insulating film, the first electrode, and the transparent protective layer) of a light emitting device may contain silicon, thereby improving each layer of adhesiveness. Another structure of the present invention is a light emitting device comprising a plurality of light emitting elements having a cathode, a layer containing an organic compound, and an anode, wherein a highly thermo stable planarizing film containing silicon is formed over a substrate having an insulating surface, an anode containing silicon and a bank covering an edge portion of the anode are formed over the highly thermostable planarizing film, a layer containing an organic compound is formed over the anode, a cathode is formed over the layer containing an organic compound, and a protective film containing silicon is formed over the cathode.

In the above structure, a TFT using the highly thermostable planarizing film containing silicon as an interlayer insulating film is electrically connected to the anode.

Each layer (the interlayer insulating film, the base insulating film, the gate insulating film, the first electrode, the second electrode, and the transparent protective layer) of a light emitting device may contain one of silicon and silicon oxide, thereby improving each layer of adhesiveness and improving reliability. Another structure of the present invention is a light emitting device comprising a plurality of light emitting elements having a cathode, a layer containing an organic compound, and an anode, wherein a highly thermostable planarizing film containing one of silicon and silicon oxide is formed over a substrate having an insulating surface, an anode containing one of silicon and silicon oxide and a bank covering an edge portion of the anode are formed over the highly thermostable planarizing film, a layer containing an organic compound is formed over the anode, a cathode containing one of silicon and silicon oxide is formed over the layer containing an organic compound, and a protective film containing one of silicon and silicon oxide is formed over the cathode.

In the above structure, a TFT using the highly thermostable planarizing film containing one of silicon and silicon oxide as an interlayer insulating film is electrically connected to the anode.

Note that a light emitting element (an EL element) has a layer containing an organic compound that can obtain luminescence (Electro Luminescence) generated by applying an electric field, an anode, and a cathode. The luminescence in the organic compound includes luminescence in returning to a ground state from a singlet excited state (fluorescence) and luminescence in returning to a ground state from a triplet excited state (phosphorescence). A light emitting device manufactured according to the present invention is applicable to cases of using either luminescence.

A light emitting element (an EL element) having an EL layer has a structure in which the EL layer is interposed between a pair of electrodes and the EL layer normally has a laminated structure. Typically, a laminated structure of "hole transport layer/light emitting layer/electron transport layer" is given. The structure provides very high luminous efficiency, and almost all the light emitting devices that are currently under research and development adopt the structure.

Alternatively, a structure in which a hole inject layer, a hole transport layer, a light emitting layer, and an electron transport layer, or a hole inject layer, a hole transport layer, a light emitting layer, an electron transport layer, and an electron inject layer are laminated in this order over an anode may be employed. The light emitting layer may be doped with a fluorescent pigment or the like. Further, all of these layers may be formed by using a low molecular weight material or using a high molecular weight material. In addition, a layer containing an inorganic material may be used. Note that all layers provided between a cathode and an anode are generically referred to as an EL layer in this specification. Therefore, all of the hole inject layer, the hole transport layer, the light emitting layer, the electron transport layer, and the electron inject layer are included in the EL layer.

In the light emitting device according to the present invention, a driving method for screen display is not particularly limited. For example, a dot-sequential driving method, a line-sequential driving method, a plane-sequential driving method, or the like can be used for the driving method. Typically, the line-sequential driving method is employed, and a time gray scale driving method or an area gray scale driving method may appropriately be used. In addition, a video signal inputted to a source line of the light emitting device may be an analog signal or a digital signal. A driving circuit or the like may appropriately be designed in accordance with the video signal.

In a light emitting device in which a video signal is digital, a video signal inputted to a pixel includes a constant voltage (CV) video signal and a constant current (CC) video signal. The constant voltage (CV) video signal includes a signal in which voltage applied to a light emitting element is constant (CVCV) and a signal in which current applied to a light emitting element is constant (CVCC). In addition, the constant current (CC) video signal includes a signal in which voltage applied to a light emitting element is constant (CCCV) and a signal in which current applied to a light emitting element is constant (CCCC).

In this specification, light extraction efficiency means a rate of light emitted to atmospheric air from a transparent substrate of an element to light generated in the element.

The present invention is applicable to any TFT structure. For example, the present invention can be applied to a top gate TFT, a bottom gate (inversely staggered) TFT, or a staggered TFT.

An amorphous semiconductor film, a semiconductor film including a crystal structure, a compound semiconductor film including an amorphous structure, or the like can appropriately be used as an active layer of the TFT. Further, the active layer of the TFT can be made of a semi-amorphous semiconductor film (also referred to as a microcrystal semiconductor film) which is a semiconductor having an intermediate structure of an amorphous structure and a crystal structure (including single crystal and polycrystal) and a third state which is stable in terms of free energy, and which includes a crystalline region having a short distance order and lattice distortion. The semi-amorphous semiconductor film includes a crystal grain of from 0.5 nm to 20 nm in at least a certain region thereof, and the Raman spectrum shifts to the lower side of wave number of 520 cm$^{-1}$. In addition, a diffraction peak of (111) and (220) derived from a Si crystal lattice is observed in the semi-amorphous semiconductor film by X-ray diffraction. The semi-amorphous semiconductor film contains hydrogen or halogen of at least 1 atom % as a neutralizer of a dangling bond. The semi-amorphous semiconductor film is manufactured by performing glow discharging decomposition (plasma CVD) on a silicide gas. As the silicide gas, $SiH_4$, additionally, $Si_2H_6$, $SiH_2Cl_2$, $SiHCl_3$, $SiCl_4$, $SiF_4$, or the like can be used. The silicide gas may be diluted with $H_2$, or $H_2$ and one or more of rare gas elements: He, Ar, Kr, and Ne. Dilution ratio is within the range of from 2 times to 1000 times. Pressure is roughly within the range of from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen, or carbon as an impurity element within a film is preferably at most $1\times10^{20}$ cm$^{-1}$, in particular, oxygen concentration is at most $5\times10^{19}$/cm$^3$, preferably, at most $1\times10^{19}$/cm$^3$. Note that field-effect mobility μ of a TFT using a semi-amorphous semiconductor film as an active layer is from 1 cm$^2$/Vsec to 10 cm$^2$/Vsec.

In a light emitting element according to the present invention, power consumption can be reduced by improving luminous efficiency, and a half-life time of luminance can be lengthened. In addition, generation of heat in a panel can be suppressed, and stability of an element and reliability of a light emitting device can be improved.

These and other objects, features and advantages of the present invention will become more apparent upon reading of the following detailed description along with the accompanied drawings.

(Embodiment 5)

Figure 10A:
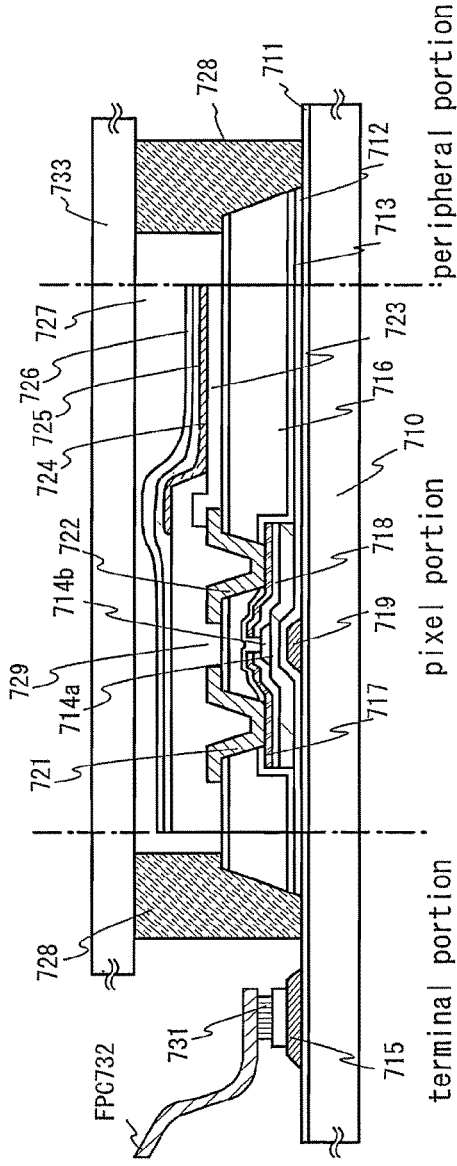
Figure 10B:
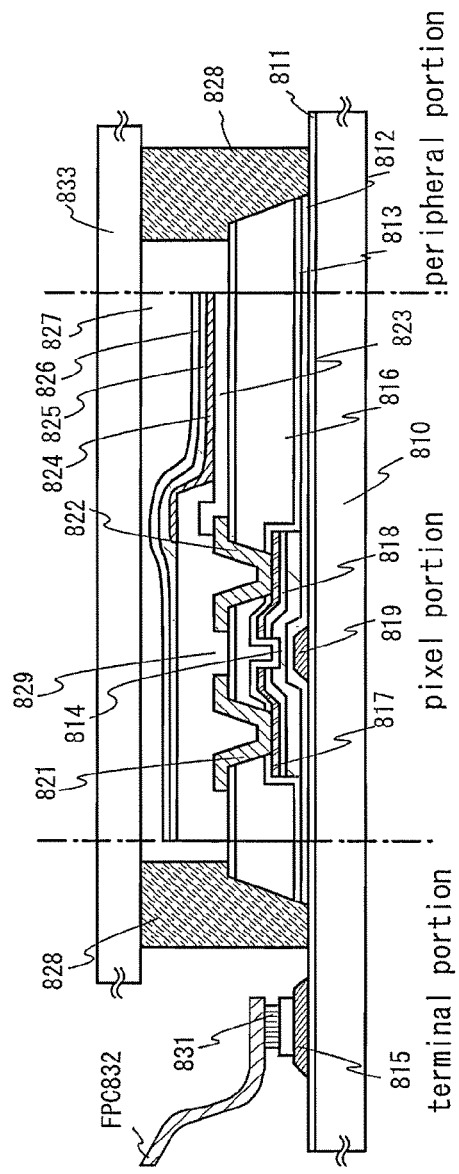

FIGS. 10A and 10B are cross-sectional views of a light emitting device. (Embodiment 6)

FIGS. 11A to 11G each show an example of electronic devices. (Embodiment 7)

Figure 12A:
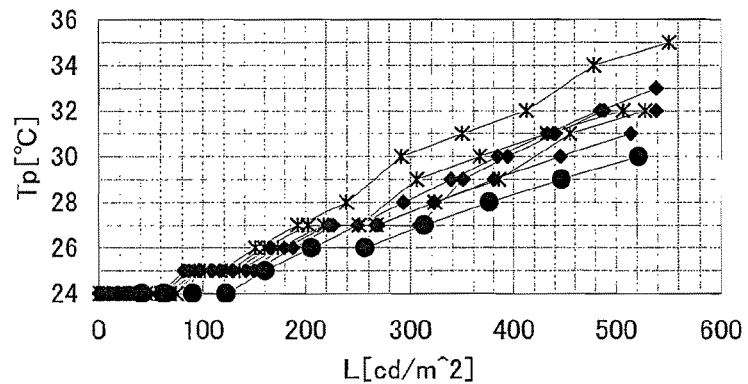
Figure 12B:
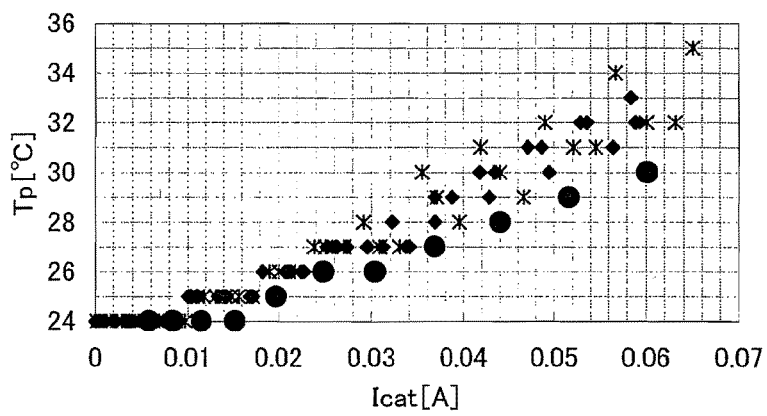

FIGS. 12A and 12B are graphs showing relation between a panel temperature and luminance and relation between a panel temperature and a cathode current.

DETAILED DESCRIPTION OF THE INVENTION

An embodiment mode of the present invention is described hereinafter.

First, a base insulating film 11 is formed over a substrate 10. In the case of extracting light, considering a substrate 10 side as a display surface, a light transmitting glass substrate or quartz substrate may be used as the substrate 10. In addition, a heat-resistant light transmitting plastic substrate which can withstand a processing temperature may be used. In the case of extracting light, considering the other side of the substrate 10 side as a display surface, a silicon substrate, a metal substrate, or a stainless steel substrate provided with an insulating film over its surface as well as the above-described substrate may be used. Here, a glass substrate is used as the substrate 10. Note that a refractive index of the glass substrate is approximately 1.55.

A base film made of an insulating film such as a silicon oxide film, a silicon nitride film, or a silicon oxynitride film is formed as the base insulating film 11. Although the base film has a two-layer structure here, it may be a single layer film of the above insulating film, or may have a laminated structure of two or more layers. Note that the base insulating film need not be formed particularly.

Next, a semiconductor layer is formed over the base insulating film. The semiconductor layer can be formed by forming a semiconductor film having an amorphous structure by a known method (sputtering, LPCVD, plasma CVD, or the like), and thereafter, patterning a crystalline semiconductor film obtained by known crystallization treatment (laser crystallization, thermal crystallization, thermal crystallization using a catalyst such as nickel, or the like) with the use of a first photomask to have a desired shape. The semiconductor layer is formed to have a thickness of from 25 nm to 80 nm (preferably, from 30 nm to 70 nm). There is no particular limitation on a material of the crystalline semiconductor film; however, the crystalline semiconductor film may preferably be made of silicon, a silicon-germanium (SiGe) alloy, or the like.

In addition, a continuous wave laser may be used for crystallization treatment of the semiconductor film having an amorphous structure. In the case of crystallizing the amorphous semiconductor film, it is preferable to apply a second harmonic to a fourth harmonic of a fundamental wave by using a solid laser which can continuously oscillate in order to obtain a crystal with a large grain size. Typically, a second harmonic (532 nm) or a third harmonic (355 nm) of an Nd:YVO$_4$ laser (a fundamental wave, 1064 nm) may be applied. In the case of using the continuous wave laser, laser light emitted from a continuous wave YVO$_4$ laser having output of 10 W is converted to a harmonic by a nonlinear optical element. There is also a method for emitting a harmonic by putting a YVO$_4$ crystal and the nonlinear optical element in a resonator. Then, the harmonic is preferably shaped into rectangular or elliptical laser light on an irradiated surface by an optical system and an object to be treated is irradiated therewith. At this time, the energy density of approximately from 0.01 MW/cm$^2$ to 100 MW/cm$^2$ (preferably, from 0.1 MW/cm$^2$ to 10 MW/cm$^2$) is required. The semiconductor film may be irradiated by being moved relatively to the laser light at the speed of approximately from 10 cm/s to 2000 cm/s.

Subsequently, an insulating film 12 covering the semiconductor layer is formed after the resist mask is removed. The insulating film 12 is formed by plasma CVD or sputtering to have a thickness of from 1 nm to 200 nm. Preferably, surface nitriding treatment using plasma by a microwave is performed after the insulating film 12 is formed to be a single layer or to have a laminated structure of an insulating film containing silicon so that a thickness thereof is made thin, from 10 nm to 50 nm.

When plasma CVD is used for forming such a thin insulating film, it is necessary to obtain a thin film thickness with good controllability by latening a formation rate. For example, film formation speed of the silicon oxide film can be set at 6 nm/min when RF power is set at 100 W, 10 kHz; pressure, 0.3 Torr; an N$_2$O gas flow, 400 sccm; and a SiH$_4$ gas flow, 1 sccm. The nitriding treatment with the use of plasma by a microwave is performed with the use of a microwave source (2.45 GHz) and a nitrogen gas which is a reactive gas.

Note that the nitrogen concentration decreases as departing from the surface of the insulating film 12. Consequently, the surface of the silicon oxide film can be nitrided at high concentration. In addition, deterioration of device properties can be prevented by reducing nitrogen at the interface between the silicon oxide film and an active layer. Note that the insulating film 12 having the surface on which nitriding treatment is performed serves as a gate insulating film of a TFT.

Next, a conductive film is formed over the insulating film 12 to have a thickness of from 100 nm to 600 nm. Here, a conductive film having a laminated structure of a TaN film and a W film is formed by using sputtering. The laminate of the TaN film and the W film is given here as the conductive film, but the conductive film is not limited thereto. As for the conductive film, a single layer of one element of Ta, W, Ti, Mo, Al, and Cu, an alloy material or a compound material containing the element as its main component, or a laminate thereof can be used. A semiconductor film typified by a polycrystalline silicon film doped with an impurity element such as phosphorous may also be used.

Subsequently, a resist mask is formed by using a second photomask, and etching is performed by dry etching or wet etching. In this etching step, the conductive film is etched to obtain conductive layers 14a, 14b, 15a, and 15b. Note that the conductive layers 14a and 14b serve as gate electrodes of the TFT and the conductive layers 15a and 15b serve as terminal electrodes.

Next, a resist mask is newly formed by using a third photomask after removing the resist mask. A first doping step for doping an impurity element which imparts n-type conductivity to a semiconductor (typically, phosphorus or As) at low concentration is performed to form an n-channel TFT not shown herein. The resist mask covers a region to be a p-channel TFT and a vicinity of the conductive layer. A low concentration impurity region is formed by performing through-dope through the insulating film by the first doping step. A plurality of TFTs is used to drive one light emitting element. However, the above-mentioned doping step is not necessary when the light emitting element is driven by only a p-channel TFT.

Then, a resist mask is newly formed by using a fourth photomask after removing the resist mask. A second doping step is performed to dope an impurity element which imparts p-type conductivity to a semiconductor (typically, boron) at high concentration. P-type high concentration impurity regions 17 and 18 are formed by performing through-dope through the insulating film 12 by the second doping step.

Then, a resist mask is newly formed by using a fifth photomask. A third doping step for doping an impurity element which imparts n-type conductivity to a semiconductor (typically, phosphorus or As) at high concentration is performed to form an n-channel TFT not shown herein. The third doping step is performed under the condition that the amount of doze is set at from $1\times10^{13}/cm^2$ to $5\times10^{15}/cm^2$; and the acceleration voltage, from 60 keV to 100 keV. The resist mask covers the region to be the p-channel TFT and a vicinity of the conductive layer. Through-dope is performed through the insulating film 12 by the third doping step to form an n-type high concentration impurity region.

Afterwards, activation and hydrogenation of the impurity element added to the semiconductor layer are performed after removing the resist mask and forming an insulating film containing hydrogen 13. The insulating film containing hydrogen 13 is made of a silicon nitride oxide film (SiNO film) obtained by PCVD. In addition, gettering for reducing nickel in a channel formation region 19 can also be performed at the same time as activation, when the semiconductor film is crystallized by using a metal element which promotes crystallization, typically, nickel. Note that the insulating film containing hydrogen 13 is a first interlayer insulating film and contains silicon oxide.

Then, a highly thermostable planarizing film 16 to be a second interlayer insulating film is formed. As the highly thermostable planarizing film 16, an insulating film in which a skeletal structure is formed by the bond of silicon (Si) and oxygen (O) obtained by application is used. Thus, the second interlayer insulating film contains silicon oxide.

Here, a procedure for forming the highly thermostable planarizing film 16 is described in detail with reference to FIGS. 5A to 5C.

First, a substrate to be treated is washed with purified water. Megasonic washing may be performed. Next, after performing dehydrobaking for 110 seconds at a temperature of 140° C., a temperature of the substrate is regulated by cooling for 120 seconds with a water-cooled plate. Next, the substrate is transferred to and placed in a spinning application apparatus shown in FIG. 5A.

Figure 5A:
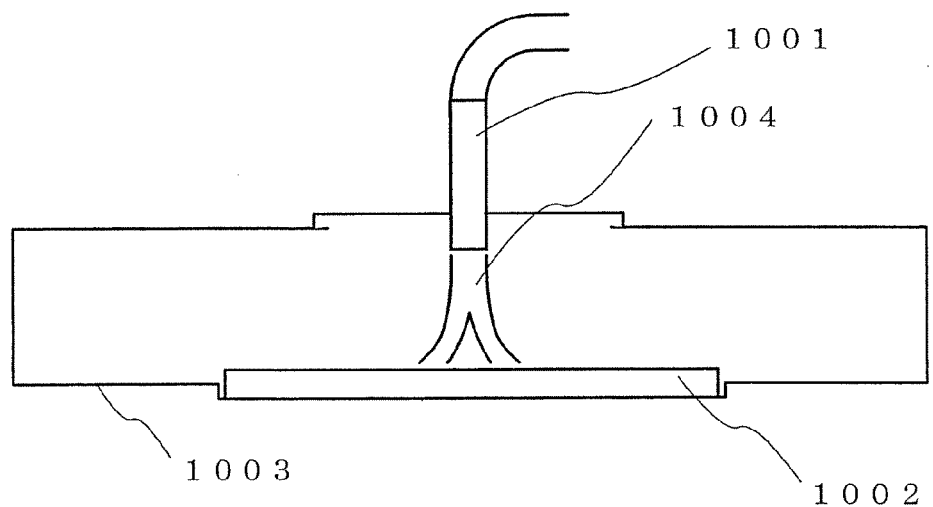
FIGS. 5A to 5C show an application apparatus and an edge remover.
Figure 5B:
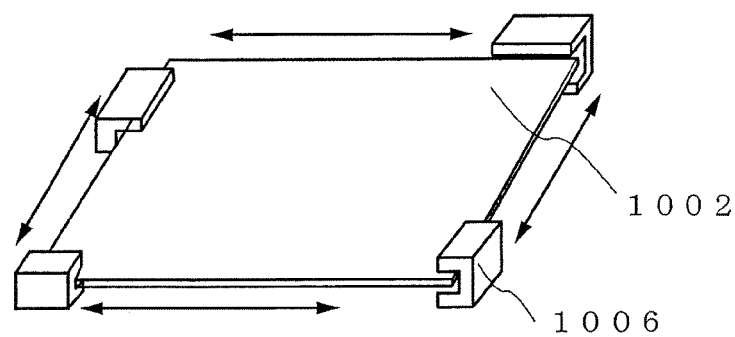
Figure 5C:
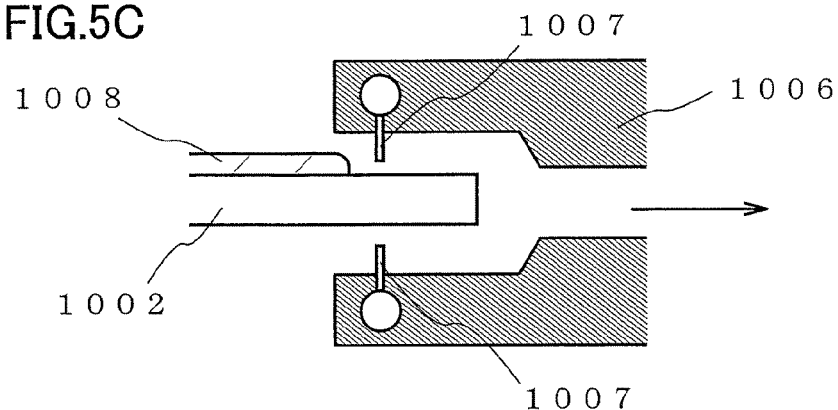
Figure 6:
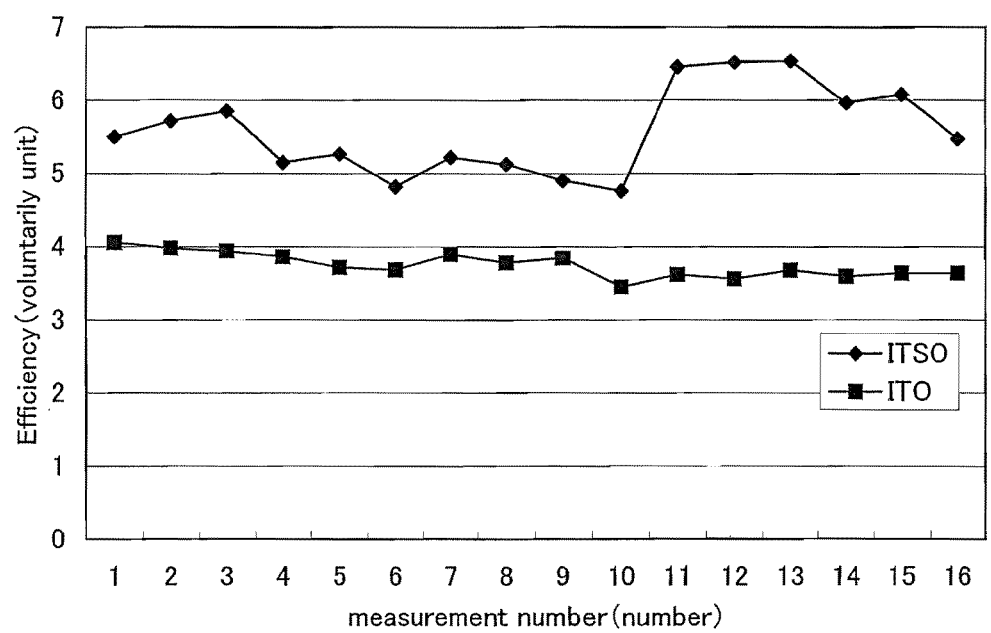
FIG. 6 is a graph showing efficiency.

FIG. 5A shows a cross-sectional schematic diagram of the spinning application apparatus. In FIG. 5A, reference numeral 1001 denotes a nozzle; 1002, a substrate; 1003, an application cup; and 1004, an application material solution. The spinning application apparatus has a mechanism that the application material solution is dropped from the nozzle 1001, the substrate 1002 is horizontally placed in the application cup 1003, and the entire application cup rotates. The spinning application apparatus has also a mechanism that the pressure of atmosphere in the application cup 1003 can be controlled.

Next, pre-wet application is performed to improve wettability by using an organic solvent such as thinner (a volatile mixture solvent mixed with aromatic hydrocarbon (toluene or the like), alcohols, ester acetate, or the like). Thinner is spread thoroughly over the substrate with centrifugal force by spinning the substrate (rotation number, 100 rpm) as 70 ml of the thinner is dropped, and then, the thinner is spun off by spinning the substrate at high speed (rotation number, 450 rpm).

Subsequently, the application material solution is thoroughly spread with centrifugal force by gradually spinning (rotation number, from 0 rpm to 1000 rpm) the substrate as the application material solution used for a liquid material in which a siloxane polymer is dissolved in a solvent (propylene glycolmonomethyl ether (molecular formula: $CH_3OCH_2CH(OH)CH_3$)) is dropped from the nozzle 1001. The siloxane polymer can be classified in terms of a siloxane structure into silica glass, an alkyl siloxane polymer, an alkyl silsesquioxane polymer, silsesquioxane polymer hydride, and the like, for example. PSB-K1 and PSB-K31 which are application insulating film materials manufactured by Toray Industries, Inc., or ZRS-5PH which is an application insulating film material manufactured by Catalysts & Chemicals Industries Co., Ltd. can be given as an example of the siloxane polymer. Then, the substrate is gradually spun (rotation number, from 0 rpm to 1400 rpm) after holding the substrate for 30 seconds to perform leveling on the application film.

Inside of the application cup 1003 is exhausted to be under reduced pressure, and then, drying under reduced pressure is performed within 1 minute.

Edge removing treatment is performed by an edge remover provided for the spinning application apparatus shown in the FIG. 5A. FIG. 5B shows an edge remover 1006 provided with a driving means which moves in parallel along the periphery of the substrate 1002. In the edge remover 1006, a thinner discharging nozzle 1007 as shown in FIG. 5C is provided side by side to sandwich one side of the substrate, and a peripheral portion of the application film 1008 is dissolved by the thinner. Thereafter, the application film in the peripheral portion of a substrate end face is removed by exhausting liquid and gas in an arrow direction shown in the figure.

Then, pre-baking is performed by baking for 170 seconds at a temperature of 110° C.

Subsequently, the substrate is carried out of the spinning application apparatus and is cooled. Thereafter, baking is further performed for one hour at a temperature of 270° C. Thus, the highly thermostable planarizing film 16 having a thickness of 0.8 µm is formed. When smoothness of the obtained highly thermostable planarizing film 16 is measured by an AFM (atomic force microscope), a P-V value (Peak to Valley, a difference between a maximum value and a minimum value of height) is approximately 5 nm and a value of Ra (average surface roughness) is approximately 0.3 nm within a region of 10 µm×10 µm.

Figure 7:
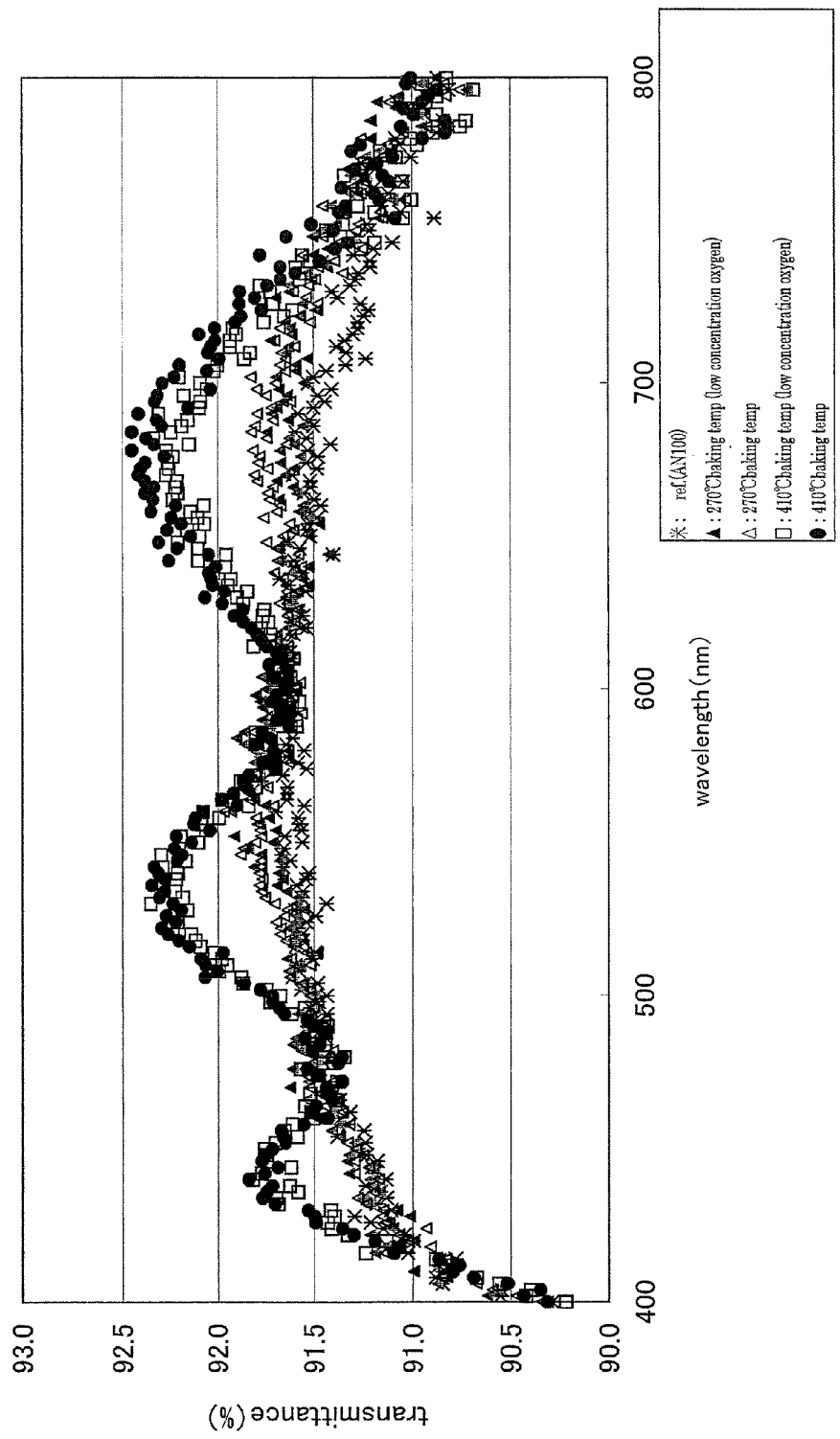
FIG. 7 is a graph showing transmittance.
Figure 8:
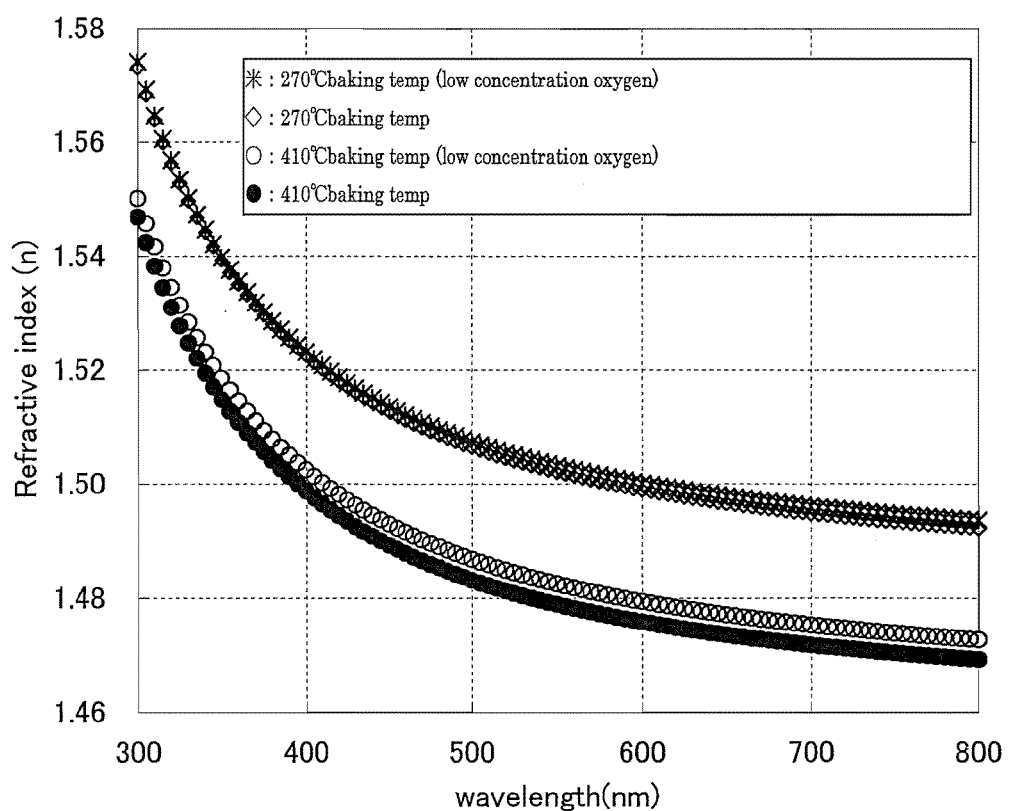
FIG. 8 is a graph showing a refractive index.

Transmittance can be changed by changing a baking temperature of the highly thermostable planarizing film 16. FIG. 7 shows transmittance of the highly thermostable planarizing film (SiOx film including an alkyl group) having a thickness of 0.8 µm under two baking temperature conditions (270° C. and 410° C.), and FIG. 8 shows a refractive index thereof. Transmittance improves in the case of setting a baking temperature at 410° C., in comparison with the case of at 270° C. Further, a refractive index decreases in the case of setting a baking temperature at 410° C.

In addition, the highly thermostable planarizing film 16 may be formed by ink-jet. A material solution can be saved in the case of employing ink-jet.

Subsequently, a third interlayer insulating film 21 is formed. Before the third interlayer insulating film is formed, heating is performed for one hour at a temperature of 250° C. for dehydration. A silicon nitride oxide film (SiNO film: 100 nm in thickness) obtained by PCVD is used as the third interlayer insulating film 21. This interlayer insulating film 21 is provided as an etching stopper film for protecting the highly thermostable planarizing film 16 that is the second interlayer insulating film when 23R and 23G are patterned in the following step. Note that the third interlayer insulating film 21 also contains silicon oxide.

FIG. 12A shows relation between a panel temperature and luminance. FIG. 12B shows relation between a panel temperature and a cathode current of a light emitting panel driven by CVCC. In FIGS. 12A and 12B, a comparative example is an active matrix light emitting panel using ITO as an anode and using a laminate of an acrylic resin and a silicon nitride film by sputtering as an interlayer insulating film. A sample A is an active matrix light emitting panel using ITSO as an anode and using a laminate of an acrylic resin and a silicon nitride film by sputtering as an interlayer insulating film. A sample B is an active matrix light emitting panel using ITSO as an anode and using a laminate of an application film with the use of a siloxane polymer (PSB-K31) and a SiNO film by PCVD as an interlayer insulating film.

FIG. 12A shows that rise in a panel temperature according to rise in luminance is suppressed most in the sample B. FIG. 12B shows that rise in a panel temperature according to rise in a cathode current is also suppressed most in the sample B. These results show that Joule heat generated in a panel is suppressed in the sample B which is an example of structures of the present invention. Suppression of heat generated in a panel leads to improvement in reliability of a light emitting device.

Subsequently, the interlayer insulating film 21 in the peripheral portion is removed at the same time as forming a contact hole in the interlayer insulating film 21 with the use of a sixth mask. Etching treatment is performed on the interlayer insulating film 21, using $CHF_3$ and Ar as an etching gas.

Thereafter, etching is performed using the sixth mask without change as a mask, thereby removing the highly thermostable planarizing film in the peripheral portion at the same time as forming a contact hole in the highly thermostable planarizing film 16. Here, etching (wet etching or dry etching) is performed under such a condition that selection ratio with the insulating film 13 can be obtained. Although there is no limitation on an etching gas to be used, it is suitable to use $CF_4$, $O_2$, He, or Ar here. Dry etching is performed with the flow of $CF_4$ of 380 sccm; the flow of $O_2$, 290 sccm; the flow of He, 500 sccm; the flow of Ar, 500 sccm; RF power, 3000 W; and pressure, 25 Pa. Note that etching time may be increased by approximately from 10% to 20% in order to perform etching without leaving a residue over a surface of the insulating film 13. Etching may be conducted once or a plurality of times to obtain a tapered shape. Here, the tapered shape is obtained by further performing a second dry etching using $CF_4$, $O_2$, and He with the flow of $CF_4$ of 550 sccm; the flow of $O_2$, 450 sccm; the flow of He, 350 sccm; RF power, 3000 W; and pressure, 25 Pa. It is desirable to set a taper angle θ of an edge portion of the highly thermostable planarizing film at more than 30° and less than 75°.

In addition, doping treatment of an inert element may be performed on an edge portion of the highly thermostable planarizing film to form a highly densified portion in the tapered portion of the highly thermostable planarizing film. The doping treatment may be performed by ion doping or ion implantation. Typically, argon (Ar) is used as the inert element. Distortion is given by adding an inert element having a comparatively large atomic radius, and a surface (including a side wall) is modified or highly densified, thereby preventing entry of moisture or oxygen. The inert element contained in the highly densified portion is set at within the concentration range of from $1\times10^{19}/cm^3$ to $5\times10^{21}/cm^3$, typically, from $2\times10^{19}/cm^3$ to $2\times10^{21}/cm^3$. Note that the edge portion of the highly thermostable planarizing film is formed to have a tapered shape, so that the side wall of the highly thermostable planarizing film is easy to be doped.

Subsequently, etching is performed using the sixth mask without change as a mask to selectively remove exposed insulating films 12 and 13. The etching treatment is performed on the insulating films 12 and 13 by using $CHF_3$ and Ar as an etching gas. Note that etching time may be increased by approximately from 10% to 20% in order to perform etching without leaving a residue over the semiconductor layer.

After removing the sixth mask and forming a conductive film (TiN/Al/TiN), etching (dry etching with a mixed gas of $BCl_3$ and $Cl_2$) is performed using a seventh mask to form a wiring 22. Note that TiN is one of materials having preferable adhesiveness with the highly thermostable planarizing film. In addition, it is preferable to set N content of TiN at less than 44% to be in contact with a source region or a drain region of a TFT.

Subsequently, first electrodes 23R and 23G, in other words, an anode (or a cathode) of an organic light emitting element is formed with the use of an eighth mask. A film containing as its main component one element of Ti, TiN, $TiSi_xN_y$, Ni, W, $WSi_x$, $WN_x$, $WSi_xN_y$, NbN, Cr, Pt, Zn, Sn, In, and Mo, an alloy material or a compound material containing the element as its main component, or a laminate thereof may be used as a material of the first electrodes 23R and 23G within the range of from 100 nm to 800 nm in thickness in total.

In the case of extracting light, considering the substrate 10 side as a display surface, ITSO (indium tin oxide containing silicon oxide formed by using a target made of ITO containing silicon oxide of from 2% to 10% by weight) is used as a material of the first electrode. In addition to ITSO, a transparent conductive film such as a light transmitting oxide conductive film which contains silicon oxide and in which indium oxide is mixed with zinc oxide (ZnO) of from 2% to 20% may also be used. Moreover, a transparent conductive film of ATO (antimony tin oxide) containing silicon oxide may be used.

Subsequently, an insulator 29 (referred to as a bank, a partition wall, a barrier, or the like) is formed using a ninth mask to cover edge portions of the first electrodes 23R and 23G. An SOG film (for example, a SiOx film including an alkyl group) obtained by application may be used for the insulator 29 within the range of from 0.8 μm to 1 μm in thickness. Either dry etching or wet etching can be performed as the etching; however, the insulator 29 is formed by dry etching using a mixed gas of $CHF_3$, $O_2$, and He here. In the dry etching, an etching rate of the SiOx film including an alkyl group is from 500 nm/min to 600 nm/min, and on the other hand, an etching rate of an ITSO film is equal to or less than 10 nm/min; thus, sufficient selection ratio is obtained. A TiN film having good adhesiveness is a top surface, since the wiring 22 is covered with the insulator 29 made of the SiOx film including an alkyl group.

Next, layers containing an organic compound 24H, 24R, 24E, and 24G are formed by evaporation or application. It is preferable to perform vacuum heating and deaeration before forming the layers containing an organic compound 24H, 24R, 24E, and 24G in order to improve reliability. For example, it is preferable to perform heat treatment at a temperature of from 200° C. to 300° C. under a reduced pressure atmosphere or an inert atmosphere in order to remove a gas included in the substrate, before evaporating an organic compound material. Here, the interlayer insulating film and the bank are made of a highly thermostable SiOx film; therefore, heat treatment at high temperature does not cause a problem.

In the case of forming the layer containing an organic compound by application using spin coating, an application layer is preferably baked by vacuum heating. For example, an aqueous solution of poly(ethylene dioxythiophene)/poly(styrene sulfonic acid) (PEDOT/PSS) to serve as a hole inject layer 24H may be applied to an entire surface and be baked. In addition, the hole inject layer may be formed by evaporation.

Subsequently, evaporation is employed to form the layers containing an organic compound 24R, 24G, and 24E, and the evaporation is performed in a film formation chamber which is vacuum evacuated to at most $5\times 10^{-3}$ Torr (0.665 Pa), preferably from $10^{-4}$ Torr to $10^{-6}$ Torr. The organic compound is preliminarily vaporized by resistance heating in evaporating. The vaporized organic compound is scattered in the direction of the substrate by opening a shutter at the time of evaporation. The vaporized organic compound is scattered upwardly and is evaporated over the substrate through an opening provided for a metal mask.

A mask is aligned for every color of light emission (R, G, and B) to perform full color display.

For example, $Alq_3$ added with DCM is deposited to be 40 nm as the light emitting layer 24R. In addition, $Alq_3$ added with DMQD is formed to be 40 nm as the light emitting layer 24G. Although not shown here, PPD (4,4'-bis(N-(9-phenanthryl)-N-phenylamino)biphenyl) added with CBP (4,4'-bis (N-carbazolyl)-biphenyl) is formed to be 30 nm as a blue light emitting layer, and SAlq (bis(2-methyl-8-quinolinolate) (triphenylsilanolate)aluminum) is formed to be 10 nm as a blocking layer.

Subsequently, $Alq_3$ is formed to be 40 nm as an electron transport layer 24E. Thereafter, a second electrode 25, that is, a cathode (or an anode) of the organic light emitting element is formed. An alloy film such as MgAg, MgIn, AlLi, $CaF_2$, or CaN, or a film in which an element belonging to Group 1 or 2 in the periodic table and aluminum are formed by co-evaporation may be used as a material of the second electrode 25. In the case of making the second electrode 25 light transmitting, an aluminum film or an aluminum film that contains a minute amount of Li having a thickness of from 1 nm to 10 nm is used, and a transparent conductive film may be formed thereover.

Further, a light transmitting layer (film thickness of from 1 nm to 5 nm) made of $CaF_2$, $MgF_2$, or $BaF_2$ may be formed as a cathode buffer layer before forming the second electrode 25.

In addition, a protective layer for protecting the second electrode 25 may be formed. For example, a protective film made of a silicon nitride film can be formed by using a diskform target made of silicon and by making the atmosphere inside the film formation chamber a nitride atmosphere or an atmosphere including nitride and argon. Further, a silicon nitride oxide film may be formed as the protective film. Further, a thin film containing carbon as its main component (a DLC film, a CN film, or an amorphous carbon film) may be formed as the protective film, and a CVD chamber may be provided separately. A diamond-like carbon film (also referred to as a DLC film) can be formed by a method such as plasma CVD (typically, RF plasma CVD, microwave CVD, electron cyclotron resonance (ECR) CVD, or hot filament CVD), combustion flame, sputtering, ion beam evaporation, or laser evaporation. A hydrogen gas and a hydrocarbon gas (for example, $CH_4$, $C_2H_2$, $C_6H_6$, or the like) are used as a reaction gas used for film formation and are subjected to ionization with glow discharging. Ions are accelerated for collision against a cathode to which negative self-bias is applied to form a film. In addition, the CN film may be formed by using a $C_2H_4$ gas and an $N_2$ gas as a reaction gas. Note that the DLC film and the CN film are insulating films transparent or translucent to visible light. The term "transparent to visible light" used herein means that transmittance of visible light is in the range of from 80% to 100% while the term "translucent to visible light" used herein means that transmittance of visible light is in the range of from 50% to 80%. Note that the protective film need not be provided when it is not required.

Next, the light emitting element is sealed by attaching a sealing substrate 33 with a sealant 28. The sealing substrate is attached so that the sealant 28 covers an edge portion (tapered portion) of the highly thermostable planarizing film 16. Note that a region surrounded by the sealant 28 is filled with a transparent filler 27. There is no particular limitation on the filler 27 as long as the filler is a light transmitting material. Typically, an ultraviolet curable or heat curable epoxy resin may be used. Here, a highly thermostable UV epoxy resin (product name: 2500 Clear, manufactured by Electrolite Cooperation) may be used, which has a refractive index of 1.50, a viscosity of 500 cps, a Shore D hardness of 90, a tensile strength of 3000 psi, a Tg point of 150° C., volume resistivity of $1\times10^{15}$ Ω·cm, and a withstand voltage of 450 V/mil. In addition, total transmittance can be improved by filling interspace between a pair of the substrates with the filler 27.

Figure 1A:
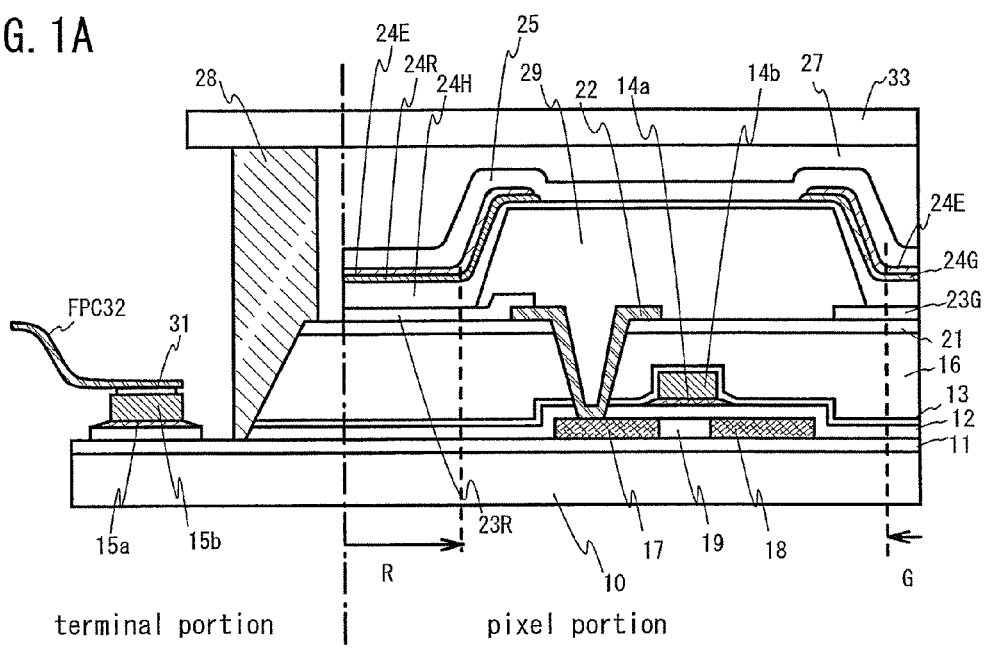
FIGS. 1A and 1B are a cross-sectional view and a top view of the present invention.

Lastly, an FPC 32 is attached to the terminal electrodes 15$a$ and 15$b$ with an anisotropic conductive film 31 by a known method. The terminal electrodes 15$a$ and 15$b$ are formed simultaneously with a gate wiring. (FIG. 1A)

Figure 1B:
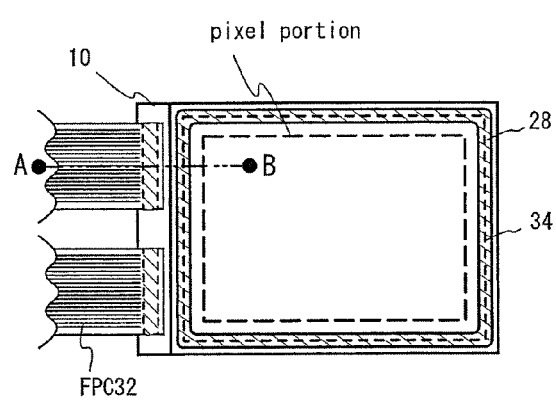

FIG. 1B is a top view. An edge portion 34 of the highly thermostable planarizing film is covered with the sealant 28 as shown in FIG. 1B. A cross-sectional view taken along a chained line A-B in FIG. 1B corresponds to FIG. 1A.

In the thus manufactured active matrix light emitting device, the highly thermostable planarizing film 16, typically, a material in which a skeletal structure is formed by the bond of silicon (Si) and oxygen (O) is used for an interlayer insulating film of the TFT. The bank is also made of the same material and the first electrode contains silicon oxide. The active matrix light emitting device is made of a material including silicon oxide which is comparatively stable. Accordingly, reliability of the light emitting device is increased.

When the first electrode is made of a transparent material and the second electrode is made of a metal material, the light emitting device has a structure for extracting light through the substrate 10, that is, a bottom emission type. When the first electrode is made of a metal material and the second electrode is made of a transparent material, the light emitting device has a structure for extracting light through the sealing substrate 33, that is, a top emission type. When the first electrode and the second electrode are made of a transparent material, the light emitting device has a structure for extracting light through both the substrate 10 and the sealing substrate 33. In the present invention, any one of the structures may appropriately be employed.

Silicon oxide (approximately, 1.46) is contained in layers through which light emitted from a light emitting layer passes, that is, all of the first electrode, the first interlayer insulating film 13, the second interlayer insulating film 16, the third interlayer insulating film 21, the gate insulating film 12, and the base insulating film 11. Therefore, difference in each refractive index decreases and light extraction efficiency increases in the case of extracting light through the substrate 10. In other words, stray light among material layers having different refractive indexes can be reduced.

Figure 2:
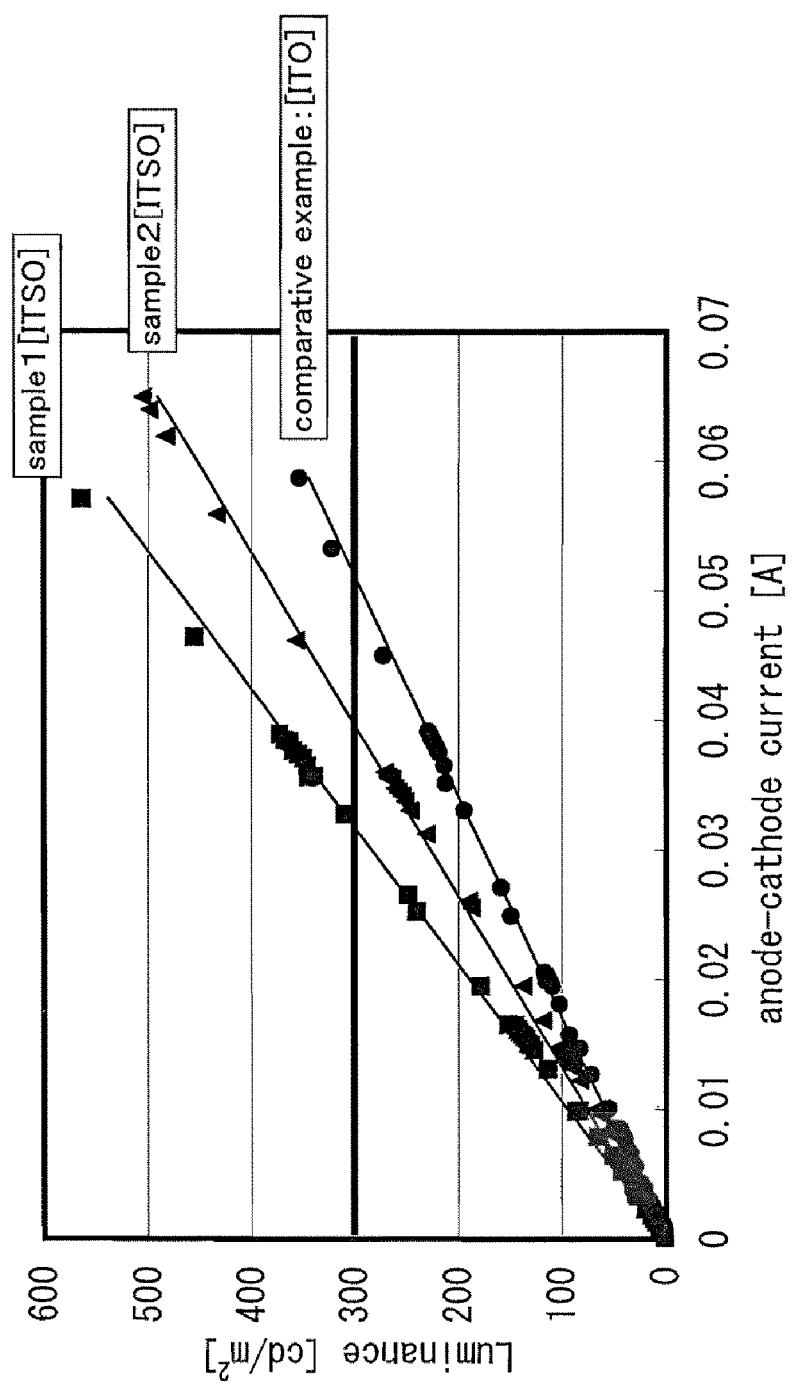
FIG. 2 shows luminance-current characteristics.

FIG. 2 shows current-luminance characteristics of the light emitting device. As shown in FIG. 2, luminance of a sample 1 and a sample 2 is improved by up to half, compared with a comparative example. In the sample 1 and the sample 2, the highly thermostable planarizing film obtained by application with the use of a siloxane polymer is used as the second interlayer insulating film, and ITSO is used as the first electrode. However, acrylic is used for the bank of the sample 1 and the sample 2. In the comparative example, ITO is used as the first electrode, acrylic obtained by application is used as the second interlayer insulating film, and acrylic is used as the bank.

Figure 3:
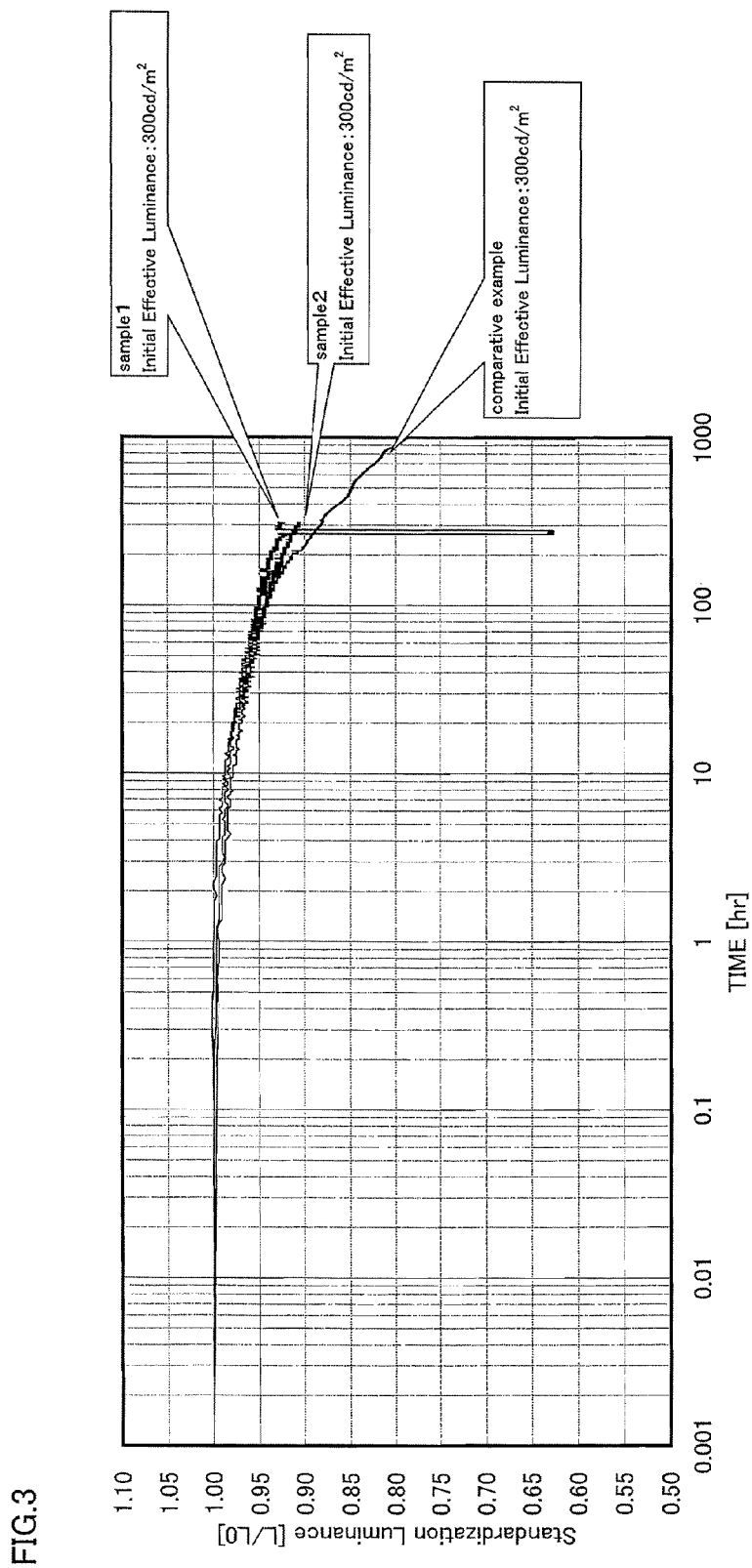
FIG. 3 shows a result of an aging test.

FIG. 3 shows each result of a room temperature aging test of the sample 1, the sample 2, and the comparative example. The present invention is effective in long-term reliability as shown in FIG. 3.

Further, the present invention can prevent increase in panel temperature accompanied with increase in luminance or increase in a cathode current, as shown in FIGS. 12A and 12B.

The present invention having the above structures is described in more detail in the following embodiments.

[Embodiment 1]

Figure 4A:
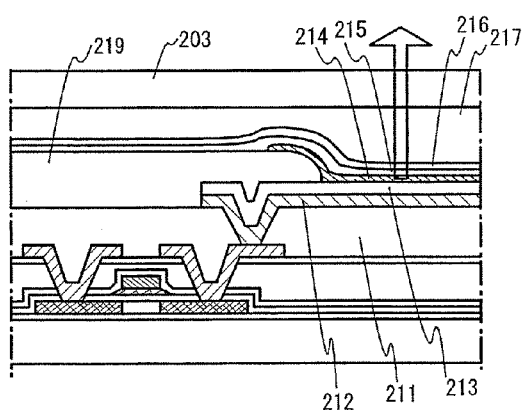
FIGS. 4A to 4D are cross-sectional views of a light emitting element.
Figure 4B:
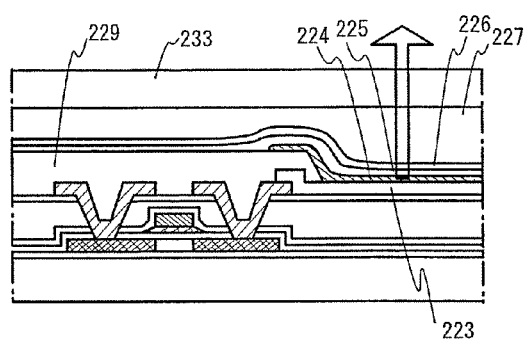
Figure 4C:
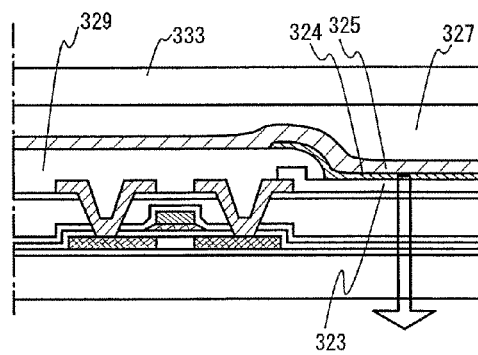

An example of a bottom emission light emitting device is described in this embodiment with reference to FIG. 4C.

First, a TFT which is connected to a light emitting element is manufactured over a light transmitting substrate (glass substrate: a refractive index of approximately 1.55). Since the light emitting device is a bottom emission type, a highly light transmitting material is used for an interlayer insulating film, a gate insulating film, and a base insulating film. Here, a SiNO film formed by PCVD is used as first and third interlayer insulating films. A SiOx film formed by application is used as a second interlayer insulating film.

Subsequently, a first electrode 323 which is electrically connected to the TFT is formed. An ITSO film which is a transparent conductive film containing SiOx (film thickness: 100 nm) is used for the first electrode 323. The ITSO film is formed by sputtering using a target in which indium tin oxide is mixed with silicon oxide ($SiO_2$) of from 1% to 10% with Ar gas flow rate of 120 sccm, $O_2$ gas flow rate of 5 sccm, pressure of 0.25 Pa, and electric power of 3.2 kW. Then, heat treatment is performed for one hour at a temperature of 200° C., after forming the ITSO film.

Subsequently, a bank 329 is formed to cover a peripheral edge portion of the first electrode 323. The bank 329 can be made of an inorganic material (silicon oxide, silicon nitride, silicon oxynitride, or the like), a photosensitive or non-photosensitive organic material (polyimide, acrylic, polyamide, polyimideamide, a resist, or benzocyclobutene), an SOG film obtained by application (for example, a SiOx film including an alkyl group), a laminate of these materials, or the like.

In this embodiment, the bank 329 is patterned by wet etching to have a curved surface with a radius of curvature only in its top edge portion. For instance, it is preferable to use a positive photosensitive acrylic as the bank 329 and to make only a top edge portion of the bank have a curved surface with a radius of curvature. Both a negative photosensitive material that is insoluble in an etchant by irradiation of light to which the material is photosensitive and a positive photosensitive material that is soluble in an etchant by irradiation of light can be used for the insulator.

Subsequently, a layer containing an organic compound 324 is formed by evaporation or application. A light emitting element which emits green light is fowled in this embodiment. CuPc (20 nm) and NPD (40 nm) are laminated by evaporation, and $Alq_3$ doped with DMQd (37.5 nm), $Alq_3$ (37.5 nm), and $CaF_2$ (1 nm) are sequentially laminated by co-evaporation.

An alloy film such as MgAg, MgIn, AlLi, $CaF_2$, or CaN, or a film in which an element belonging to Group 1 or 2 in the periodic table and aluminum are formed by co-evaporation may be used as the second electrode 325. In this embodiment, Al is evaporated to have a thickness of 200 nm. In addition, a protective-film may be laminated if necessary.

Subsequently, the light emitting element is sealed by attaching a sealing substrate 333 with a sealant (not shown). A space 327 between the sealing substrate and the second electrode is filled with an inert gas or a filler made of a transparent resin.

A bottom emission light emitting device is completed according to the above steps. In this embodiment, a refractive index or film thickness of each layer (the interlayer insulating film, the base insulating film, the gate insulating film, or the first electrode) is determined within an adjustable range. Accordingly, light reflection at an interface of the layer is reduced and light extraction efficiency is improved.

[Embodiment 2]

An example of a top emission light emitting device is described in this embodiment with reference to FIG. 4A.

First, a TFT which is connected to a light emitting element is manufactured over a substrate having an insulating surface. Since the light emitting device is a top emission type, a light transmitting material need not necessarily be used for an interlayer insulating film, a gate insulating film, and a base insulating film. In this embodiment, a SiNO film formed by PCVD is used for first and third interlayer insulating film as a highly stable material film. A SiOx film formed by application is used for a second interlayer insulating film as a highly stable material film.

Further, a fourth interlayer insulating film 211 is provided. The SiOx film formed by application is used also for the fourth interlayer insulating film 211.

Subsequently, the fourth interlayer insulating film 211 is selectively etched to form a contact hole reaching an electrode of the TFT. Thereafter, a reflective metal film (Al—Si film (film thickness: 30 nm)), a material film having a large work function (TiN film (film thickness: 10 nm)), and a transparent conductive film (ITSO film (film thickness: from 10 nm to 100 nm)) are sequentially formed. Then, patterning is performed to form a reflecting electrode 212 and a first electrode 213 which are electrically connected to the TFT.

Subsequently, a bank 219 is formed to cover an edge portion of the first electrode 213. The bank 219 can be made of an inorganic material (silicon oxide, silicon nitride, silicon oxynitride, or the like), a photosensitive or non-photosensitive organic material (polyimide, acrylic, polyamide, polyimideamide, a resist, or benzocyclobutene), an SOG film obtained by application (for example, a SiOx film including an alkyl group), or a laminate of these materials.

Next, a layer containing an organic compound 214 is formed by evaporation or application.

An aluminum film or an aluminum film that contains a minute amount of Li, having a thickness of from 1 nm to 10 nm is used for a second electrode 215 in order to make the light emitting device a top emission type. In addition, a transparent conductive film comprising one of ITSO and ITO may be laminated if necessary.

Subsequently, a transparent protective layer 216 is formed by evaporation, sputtering or plasma CVD. The transparent protective layer 216 is made of a silicon nitride oxide film (SiNO film) or a silicon nitride film (SiN film). The transparent protective layer 216 protects the second electrode 215.

Then, the light emitting element is sealed by attaching a sealing substrate 203 with a sealant. Note that a region surrounded by the sealant is filled with a transparent filler 217. There is no particular limitation on the filler 217 as long as the filler is a light transmitting material. Typically, an ultraviolet curable or heat curable epoxy resin may be used. In addition, total transmittance can be improved by filling interspace between a pair of substrates with the filler 217.

According to the above steps, the top emission light emitting device is completed. In this embodiment, each layer (the interlayer insulating film, the base insulating film, the gate insulating film, and the first electrode) contains SiOx, thereby improving reliability.

[Embodiment 3]

A top emission light emitting device which is different from that of Embodiment 2 is described in this embodiment with reference to FIG. 4B.

First, a TFT which is connected to a light emitting element is manufactured over a substrate having an insulating surface. Since the light emitting device is a top emission type, a light transmitting material is not necessarily used for an interlayer insulating film, a gate insulating film, or a base insulating film. In this embodiment, a SiNO film obtained by PCVD is used for first and third interlayer insulating film as a highly stable material film. Further, a SiOx film obtained by application is used for a second interlayer insulating film as a highly stable material film. The interlayer insulating film and the gate insulating film are selectively etched to form a contact hole reaching an active layer of the TFT. After a conductive film (TiN/Al—Si/TiN) is formed, it is etched (dry etching with a mixed gas of $BCl_3$ and $Cl_2$) by using a mask to form a source electrode and a drain electrode of the TFT.

Subsequently, a first electrode 223 which is electrically connected to the drain electrode (or the source electrode) of the TFT is formed. As for a material of the first electrode 223, a material having a large work function, for example, a film containing as its main component one element of TiN, $TiSi_xN_y$, Ni, W, $WSi_x$, $WN_x$, $WSi_xN_y$, NbN, Cr, Pt, Zn, Sn, In, or Mo, an alloy material or a compound material containing the element as its main component, or a laminated film thereof may be used within the range of from 100 nm to 800 nm in thick in total.

Subsequently, a bank 229 is formed to cover a peripheral edge portion of the first electrode 223. An SOG film obtained by application (for example, a SiOx film including an alkyl group) is used for the bank 229. The bank 229 is formed to have a desired shape by dry etching.

Next, a layer containing an organic compound 224 is formed by evaporation or application.

An aluminum film or an aluminum film that contains a minute amount of Li, having a thickness of from 1 nm to 10 nm is used for a second electrode 225 in order to make the light emitting device a top emission type. In addition, a transparent conductive film (for example, an ITSO film) may be laminated if necessary.

Subsequently, a transparent protective layer 226 is formed by evaporation or sputtering. The transparent protective layer 226 protects the second electrode 225.

Next, the light emitting element is sealed by attaching a sealing substrate 233 with a sealant. Note that a region surrounded by the sealant is filled with a transparent filler 227. There is no particular limitation on the filler 227 as long as the filler is a light transmitting material. Typically, an ultraviolet curable or heat curable epoxy resin may be used. In addition, total transmittance can be improved by filling interspace between a pair of substrates with the filler 227.

According to the above steps, the top emission light emitting device is completed. In this embodiment, each layer (the interlayer insulating film, the base insulating film, the gate insulating film, and the bank) contains SiOx, thereby improving reliability.

[Embodiment 4]

An example of a light emitting device in which light can be extracted from both substrates is described with reference to FIG. 4D.

First, a TFT which is connected to a light emitting element is manufactured over a light transmitting substrate (glass substrate: a refractive index of approximately 1.55). Since the light emitting device of this embodiment performs display by passing light through a transparent substrate, a highly light transmitting material is used for an interlayer insulating film, a gate insulating film, and a base insulating film. Here, a SiNO film formed by PCVD is used as first and third interlayer insulating films. A SiOx film formed by application is used as a second interlayer insulating film.

Subsequently, a first electrode 423 which is electrically connected to the TFT is formed. ITSO that is a transparent conductive film containing SiOx (film thickness: 100 nm) is used for the first electrode 423.

Subsequently, a bank 429 is formed to cover a peripheral edge portion of the first electrode 423. The bank 429 can be made of an inorganic material (silicon oxide, silicon nitride, silicon oxynitride, or the like), a photosensitive or non-photosensitive organic material (polyimide, acrylic, polyamide, polyimideamide, a resist, or benzocyclobutene), an SOG film obtained by application (for example, a SiOx film including an alkyl group), or a laminate of these materials.

In this embodiment, the bank 429 is patterned by wet etching to have a curved surface with a radius of curvature only in its top edge portion.

Subsequently, a layer containing an organic compound 424 is formed by evaporation or application.

An aluminum film or an aluminum film that contains a minute amount of Li, having a thickness of from 1 nm to 10 nm is used for a second electrode 425 in order to extract light to a sealing substrate side. In addition, a transparent conductive film may be laminated if necessary.

Subsequently, a transparent protective layer 426 is formed by evaporation or sputtering. The transparent protective layer 426 protects the second electrode 425.

Next, the light emitting element is sealed by attaching a sealing substrate 433 with a sealant. A light transmitting substrate (glass substrate: a refractive index of approximately 1.55) is used also as the sealing substrate 433. Note that a region surrounded by the sealant is filled with a transparent filler 427. There is no particular limitation on the filler 427 as long as the filler is a light transmitting material. Typically, an ultraviolet curable or heat curable epoxy resin may be used. In addition, total transmittance can be improved by filling interspace between a pair of substrates with the filler 427.

Figure 4D:
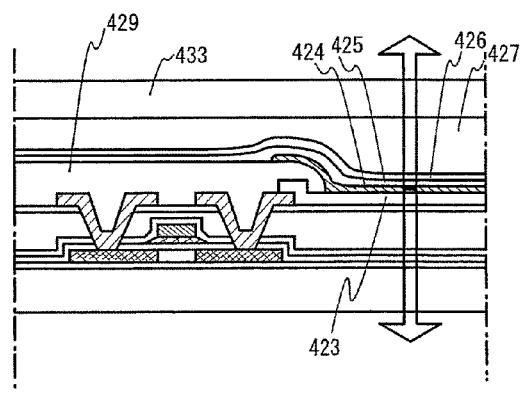

In a light-emitting device which emits light on both sides as shown in FIG. 4D, two pieces of polarizing plates are disposed to sandwich a light-emitting panel so that a direction of polarization of light is to be perpendicular thereto. Accordingly, a display can be prevented from being hard to be recognized because of transparency to see a background when watched from one side.

[Embodiment 5]

An example of selectively adding an inert element to a peripheral portion of an interlayer insulating film in order to prevent moisture entry from an external surface of the interlayer insulating film is described in this embodiment.

Each semiconductor layer is formed after a base insulating film is formed over a substrate 610. Subsequently, each gate electrode and each terminal electrode are formed after a gate insulating film covering the semiconductor layer is formed. Subsequently, a source region and a drain region, and an LDD region if necessary, are appropriately formed by doping an impurity element which imparts n-type conductivity to a semiconductor (typically, phosphorus or As) to form an n-channel TFT 636 and by doping an impurity element which imparts p-type conductivity to a semiconductor (typically, boron) to form a p-channel TFT 637. Subsequently, the impurity element added to the semiconductor layer is activated and hydrogenated after forming a silicon nitride oxide film (SiNO film) which contains hydrogen and which is obtained by PCVD.

Subsequently, a highly thermostable planarizing film 616 which serves as an interlayer insulating film is formed. As the highly thermostable planarizing film 616, an insulating film in which a skeletal structure is formed by the bond of silicon (Si) and oxygen (O) obtained by application is used. Then, a SiNO film is formed by PCVD. Note that the steps up to here are almost the same as those described in the embodiment mode.

Next, the highly thermostable planarizing film in a peripheral portion is removed at the same time as forming a contact hole in the SiNO film and the highly thermostable planarizing film by using a mask. Etching may be performed once or a plurality of times to obtain a tapered shape.

Next, doping treatment of an inert element is selectively performed with a portion but a peripheral portion covered with a mask to form a highly densified portion 620 on the surface of the highly thermostable planarizing film 616. The doping treatment may be performed by ion doping or ion implantation. Typically, argon (Ar) is used as the inert element. Distortion is given by adding an inert element having a comparatively large atomic radius, and a surface (including a side wall) is modified or highly densified, thereby preventing entry of moisture or oxygen. The inert element contained in the highly densified portion 20 is set within the concentration range of from $1\times10^{19}/cm^3$ to $5\times10^{21}/cm^3$, typically, from $2\times10^{19}/cm^3$ to $2\times10^{21}/cm^3$. Note that the highly thermostable planarizing film 616 is formed to have a tapered shape so that the inert element is doped into a surface (including a side wall) of the highly thermostable planarizing film 616. It is desirable to set a taper angle θ at more than 30° and less than 75°.

A solution component is prevented from entering the highly thermostable planarizing film or reacting when a step using liquid (also referred to as a wet step) is performed later by adding an inert element and modifying a surface of the highly thermostable planarizing film. In addition, moisture or a gas is prevented from being released from inside of the highly thermostable planarizing film when a heat treatment step is performed later. Further, moisture or a gas is prevented from being released from inside of the highly thermostable planarizing film by a change over time; consequently, reliability of a semiconductor device is improved.

Subsequently, etching is performed using the highly thermostable planarizing film 616 as a mask, and an exposed SiNO film or gate insulating film containing hydrogen is selectively removed.

Next, a drain wiring and a source wiring are formed by performing etching with the use of a mask after forming a conductive film.

Then, a first electrode 623 made of a transparent conductive film, in other words, an anode (or a cathode) of an organic light emitting element is formed. ITSO that is a transparent conductive film containing SiOx is used for the first electrode 623.

Subsequently, an SOG film obtained by application (for example, a SiOx film including an alkyl group) is patterned to form an insulator 629 (referred to as a bank, partition wall, a barrier, a mound, or the like) covering an edge portion of the first electrode 623.

Next, a layer containing an organic compound 624 is formed by evaporation or application. Thereafter, a second electrode 625 made of a transparent conductive film, that is, a cathode (or an anode) of an organic light emitting element is found. ITSO that is a transparent conductive film containing SiOx is used for the second electrode 625. Subsequently, a transparent protective layer 626 is formed by evaporation, sputtering, or plasma CVD. The transparent protective layer 626 is made of a silicon nitride oxide film (SiNO film) or a silicon nitride film (SiN film). The transparent protective layer 626 protects the second electrode 625.

Subsequently, the light emitting element is sealed by attaching a sealing substrate 633 with a sealant 628. In a light emitting display device, a circumference of a display portion is surrounded by the sealant and sealed with a pair of substrates. However, the interlayer insulating film of the TFT is provided over the entire surface of the substrate. Therefore, when a pattern of the sealant is drawn inside a circumference edge of the interlayer insulating film, there is a possibility that moisture or an impurity might enter from a part of the interlayer insulating film which is located outside the pattern of the sealant. Consequently, as for the circumference of the highly thermostable planarizing film used as the interlayer insulating film of the TFT, the sealant covers inside of the pattern of the sealant, preferably, the edge portion of the highly thermostable planarizing film. Note that a region surrounded by the sealant 628 is filled with a transparent filler 627.

Figure 9:
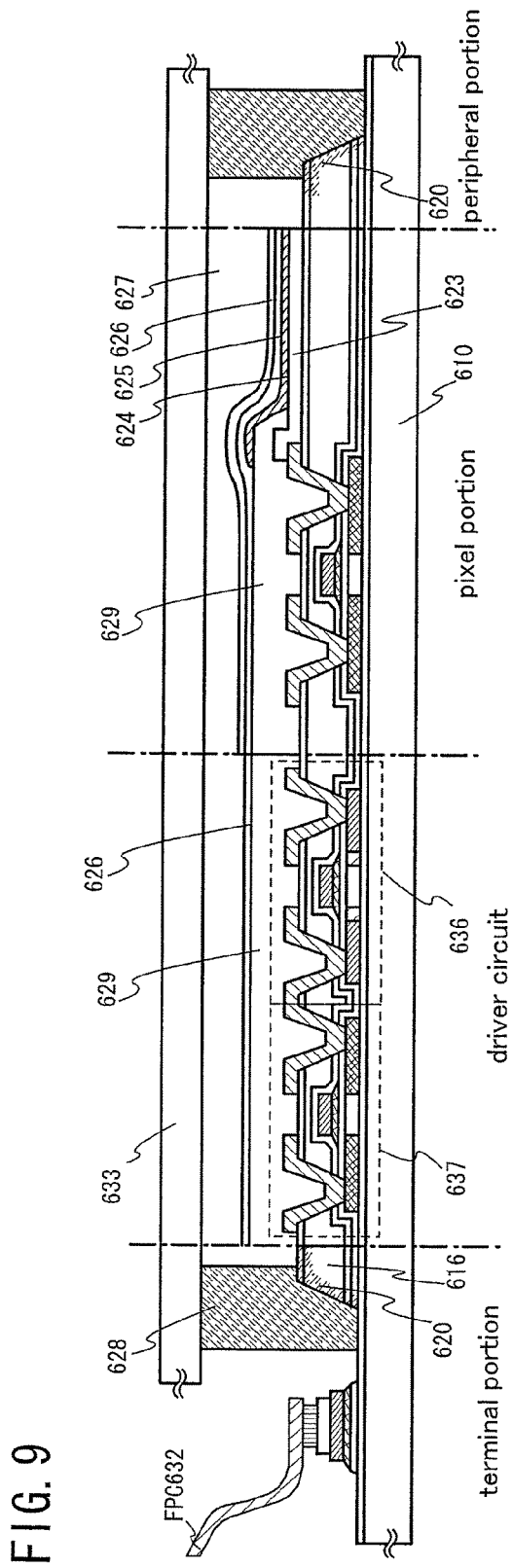
FIG. 9 is a cross-sectional view of a light emitting device.

Lastly, an FPC 632 is attached to the terminal electrode with an anisotropic conductive film 631 by a known method. A transparent conductive film is preferably used as the terminal electrode and is formed over the terminal electrode formed simultaneously with a gate wiring (FIG. 9).

According to the above steps, a pixel portion, a driver circuit, and a terminal portion are formed over one substrate.

Thus manufactured active matrix light emitting device has a structure in which an edge portion or an opening portion is formed to have a tapered shape in the highly thermostable planarizing film 616, typically, an interlayer insulating film (a film to be a base film of a light emitting element later) of a TFT in which a skeletal structure is formed by the bond of silicon (Si) and oxygen (O). Further, the active matrix light emitting device has a structure in which distortion is given by adding an inert element having a comparatively large atomic radius, and a surface (including a side wall) is modified or highly densified, thereby preventing entry of moisture or oxygen. Accordingly, reliability of the light emitting device is improved.

In addition, only a tapered portion in a peripheral portion of the highly thermostable planarizing film 616 may be covered with a metal film or a silicon nitride film, instead of doping the tapered portion with an impurity element.

In this embodiment, each layer (the interlayer insulating film, the base insulating film, the gate insulating film, the first electrode, and the second electrode) contains SiOx, thereby improving reliability.

Moreover, in this embodiment, each layer (the interlayer insulating film, the base insulating film, the gate insulating film, the first electrode, the second electrode, and the transparent protective layer) contains silicon, thereby improving each layer of adhesiveness. Adhesiveness between two layers which are in contact with each other is improved by making the layers contain a common element (here, silicon).

[Embodiment 6]

An example of an inversely staggered TFT is described in this embodiment with reference to FIGS. 10A and 10B. Portions other than a TFT and a terminal electrode are identical with those in FIG. 1A shown in the embodiment mode; therefore, detailed description is omitted here.

A TFT shown in FIG. 10A is a channel stop type. A base insulating film 711 is formed over a substrate 710. A gate electrode 719 and a terminal electrode 715 are simultaneously formed, and a semiconductor layer made of an amorphous semiconductor film 714a, an n+ layer 718, and a metal layer 717 are laminated over a gate insulating film 712. A channel stopper 714b is formed over a portion to be a channel formation region of the semiconductor layer 714a. Further, source/drain electrodes 721 and 722 are formed.

Further, a first electrode 723 is formed over a highly thermostable planarizing film 716. Further, an insulator 729 is formed to cover edge portions of the first electrode 723. Further, a layer containing an organic compound 724 is formed over the first electrode 723. Further, a second electrode 725 is formed over the layer containing an organic compound 724. Further, a protective layer 726 is formed over the second electrode 725. Further, a light emitting element is sealed by attaching a sealing substrate 733 with a sealant 728. Note that a region surrounded by the sealant 728 is filled with a transparent filler 727. Further, an FPC 732 is attached to the terminal electrode 715 with an anisotropic conductive film 731 by a known method.

A TFT shown in FIG. 10B is a channel etch type. A base insulating film 811 is formed over a substrate 810. A gate electrode 819 and a terminal electrode 815 are simultaneously formed, and a semiconductor layer made of an amorphous semiconductor film 814, an n+ layer 818, and a metal layer 817 are laminated over a gate insulating film 812. A portion to be a channel formation region of the semiconductor layer 814 is thinly etched. Further, source/drain electrodes 821 and 822 are formed.

Further, a first electrode 823 is formed over a highly thermostable planarizing film 816. Further, an insulator 829 is formed to cover edge portions of the first electrode 823. Further, a layer containing an organic compound 824 is formed over the first electrode 823. Further, a second electrode 825 is formed over the layer containing an organic compound 824. Further, a protective layer 826 is formed over the second electrode 825. Further, a light emitting element is sealed by attaching a sealing substrate 833 with a sealant 828. Note that a region surrounded by the sealant 728 is filled with a transparent filler 827. Further, an FPC 832 is attached to the terminal electrode 815 with an anisotropic conductive film 831 by a known method.

In addition, a semi-amorphous semiconductor film (also referred to as a microcrystal semiconductor film) which is a semiconductor having an intermediate structure of an amorphous structure and a crystal structure (including single crystal and polycrystal) and includes a third state which is stable in terms of free energy, and which includes a crystalline region having a short distance order and lattice distortion can also be used in place of the amorphous semiconductor film. The semi-amorphous semiconductor film is manufactured by performing glow discharging decomposition (plasma CVD) on a silicide gas. As the silicide gas, $SiH_4$, additionally, $Si_2H_6$, $SiH_2Cl_2$, $SiHCl_3$, $SiCl_4$, $SiF_4$, or the like can be used. The silicide gas may be diluted with $H_2$, or $H_2$ and one or more of rare gas elements: He, Ar, Kr, and Ne. Dilution ratio is within the range of from 2 times to 1000 times. Pressure is roughly within the range of from 0.1 Pa to 133 Pa; power frequency, from 1 MHz to 120 MHz, preferably from 13 MHz to 60 MH; and substrate heating temperature, at most 300° C., preferably from 100° C. to 250° C. An atmospheric constitution impurity such as oxygen, nitrogen, or carbon as an impurity element within a film is preferably at most $1 \times 10^{20}$ cm$^{-1}$, in particular, oxygen concentration is at most $5 \times 10^{19}/cm^3$, preferably, at most $1 \times 10^{19}/cm^3$. Note that field-effect mobility μ of a TFT using a semi-amorphous semiconductor film as an active layer is from 1 cm$^2$/Vsec to 10 cm$^2$/Vsec.

[Embodiment 7]

In this embodiment, an example of electronic devices equipped with a display portion is described with reference to FIGS. 11A to 11G. An electronic device having a light emitting device can be completed by applying the present invention.

Generation of heat in a panel is suppressed according to the present invention, thereby enabling to extend a lifetime of a light emitting device, that is, to improve reliability of an electronic device.

Examples of electronic devices are as follows: a video camera; a digital camera; a goggle type display (head mounted display); a navigating system; an audio reproducing device (car audio, an audio component, or the like); a laptop personal computer; a game machine; a personal digital assistant (a mobile computer, a cellular phone, a portable game machine, an electronic book, or the like); and an image reproducing device including a recording medium (specifically, a device capable of processing data in a recording medium such as a Digital Versatile Disc (DVD) and having a display that can display the image of the data); and the like.

Figure 11A:
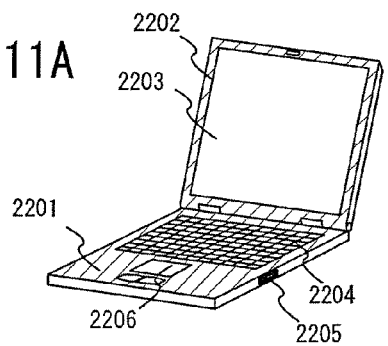
Figure 11B:
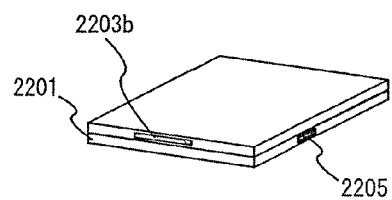

FIG. 11A is a perspective view of a laptop personal computer, and FIG. 11B is a perspective view thereof in a folded state. The laptop personal computer includes a main body 2201, a chassis 2202, display portions 2203a and 2203b, a keyboard 2204, an external connection port 2205, a pointing mouse 2206, and the like. By applying the present invention to the display portions 2203a and 2203b, generation of heat in a panel can be suppressed, and a laptop personal computer equipped with a display portion having high luminance with high luminous efficiency (light extraction efficiency), low power consumption, and high stability can be completed.

Figure 11C:
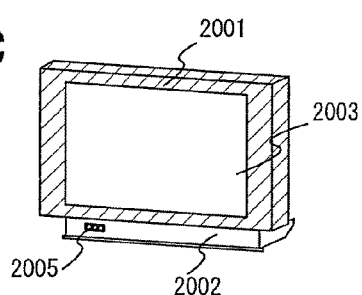

FIG. 11C shows a television, which includes a chassis 2001, a supporting section 2002, a display portion 2003, a video input terminal 2005, and the like. The television includes all televisions for displaying information, including ones for personal computers, for TV broadcasting reception, and for advertisement. By applying the present invention to the display portion 2003, generation of heat in a panel can be suppressed, and a television equipped with a display portion having high luminance with high luminous efficiency (light extraction efficiency), low power consumption, and high stability can be completed.

Figure 11D:
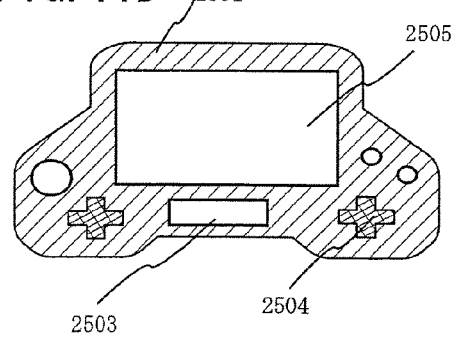

FIG. 11D shows a portable game machine, which includes a main body 2501, a display portion 2505, an operation switch 2504, and the like. By applying the present invention to the display portion 2505, generation of heat in a panel can be suppressed, and a portable game machine equipped with a display portion having high luminance with high luminous efficiency (light extraction efficiency), low power consumption, and high stability can be completed.

Figure 11E:
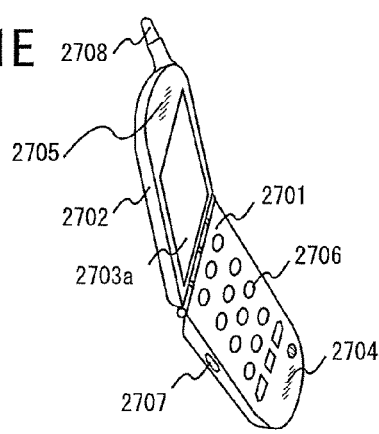
Figure 11F:
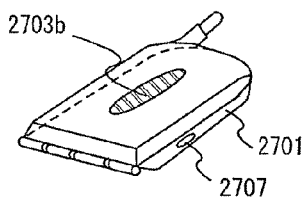

FIG. 11E is a perspective view of a cellular phone, and FIG. 11F is a perspective view thereof in a folded state. The cellular phone includes a main body 2701, a chassis 2702, display portions 2703a and 2703b, an audio input portion 2704, an audio output portion 2705, operation keys 2706, an external connection port 2707, an antenna 2708, and the like.

The cellular phone shown in FIGS. 11E and 11F is equipped with a high-resolution display portion 2703a that mainly displays an image in full color and an area color display portion 2703b that mainly displays characters and symbols. By applying the present invention to the display portions 2703a and 2703b, generation of heat in a panel can be suppressed, and a cellular phone equipped with a display portion having high luminance with high luminous efficiency (light extraction efficiency), low power consumption, and high stability can be completed.

Figure 11G:
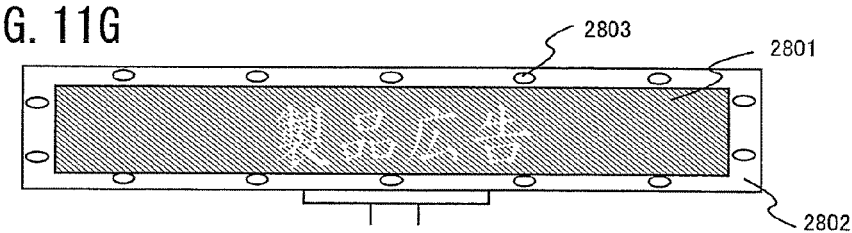

FIG. 11G shows a display board such as an advertisement board, which includes a display portion 2801, a chassis 2802, a lighting portion 2803 such as LED light, and the like. By applying the present invention to the display portion 2801, generation of heat in a panel can be suppressed, and an advertisement board equipped with a display portion having high luminance with high luminous efficiency (light extraction efficiency), low power consumption, and high stability can be completed.

As described above, a light emitting device obtained by applying the invention may be used for display portions of various electronic devices. Note that a light emitting device manufactured by employing any one of the structures of the embodiment mode, and Embodiments 1 to 6 may be used for the electronic device of this embodiment.

Manufacturing costs can be reduced by using the same material for an interlayer insulating film and a bank. In addition, cost reduction can be achieved by commonality of an apparatus such as a film formation apparatus or an etching apparatus.

This application is based on Japanese Patent Application serial no. 2003-322223 filed in Japan Patent Office on Sep. 12 in 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method for manufacturing a light emitting device comprising the steps of:
    forming a thin film transistor including a semiconductor layer having a source region, a drain region, and a channel formation region therebetween, a gate insulating film, and a gate electrode over a first substrate having an insulating surface;
    forming a highly thermostable planarizing film over an uneven shape reflected by the thin film transistor wherein the highly thermostable planarizing film is a SiOx film including an alkyl group formed by application;
    forming an opening portion which has a tapered shape on a side face and is located over the source region or the drain region and a peripheral portion which has a tapered shape by selectively removing the highly thermostable planarizing film;
    forming a contact hole which reaches the source region or the drain region by selectively removing the gate insulating film;
    forming an electrode which reaches the source region or the drain region;
    forming an anode containing SiOx which is in contact with the electrode;
    forming a bank covering an edge portion of the anode;
    forming a layer containing an organic compound over the anode;
    forming a cathode over the layer containing the organic compound; and
    attaching a second substrate to the first substrate with a sealant.

2. A method for manufacturing a light emitting device, according to claim 1, wherein the anode is formed by sputtering using a target made of indium tin oxide containing SiOx.

3. A method for manufacturing a light emitting device, comprising the steps of:
    forming a thin film transistor including a semiconductor layer over a first substrate;
    forming a first insulating film comprising a SiOx film including an alkyl group over the thin film transistor;
    removing part of the first insulating film so that an opening portion is formed in the first insulating film;
    forming an anode containing SiOx over the first insulating film wherein the anode is electrically connected to the semiconductor layer;
    forming a second insulating film covering an edge portion of the anode;
    forming a layer containing an organic compound over the anode;
    forming a cathode over the layer containing the organic compound; and
    sealing the light emitting element by attaching a second substrate to the first substrate with a sealant.

4. A method for manufacturing a light emitting device, according to claim 3, wherein the first insulating film is formed by application.

5. A method for manufacturing a light emitting device, according to claim 3, wherein the second insulating film is a SiOx film including an alkyl group formed by application.

6. A method for manufacturing a light emitting device, according to claim 3, wherein the anode is formed by sputtering using a target made of indium tin oxide containing SiOx.

7. A method for manufacturing a light emitting device, comprising the steps of:
    forming a thin film transistor including a semiconductor layer over a first substrate;
    forming a first insulating film comprising a SiOx film including an alkyl group over the thin film transistor;
    removing part of the first insulating film so that an opening portion is formed in the first insulating film;
    forming an anode containing SiOx over the first insulating film wherein the anode is electrically connected to the semiconductor layer;
    forming a second insulating film covering an edge portion of the anode;
    forming a layer containing an organic compound over the anode;
    forming a cathode over the layer containing the organic compound; and
    sealing the light emitting element by attaching a second substrate to the first substrate with a sealant so that the sealant is in contact with a peripheral portion of the first insulating film.

8. A method for manufacturing a light emitting device, according to claim 7, wherein the first insulating film is formed by application.

9. A method for manufacturing a light emitting device, according to claim 7, wherein the second insulating film is a SiOx film including an alkyl group formed by application.

10. A method for manufacturing a light emitting device, according to claim 7, wherein the anode is formed by sputtering using a target made of indium tin oxide containing SiOx.

11. A method for manufacturing a light emitting device, comprising the steps of:
    forming a thin film transistor including a semiconductor layer over a first substrate;
    forming a first insulating film comprising a SiOx film including an alkyl group over the thin film transistor;

removing part of the first insulating film so that an opening portion is formed in the first insulating film and the first insulating film has a taper portion;

forming an anode containing SiOx over the first insulating film wherein the anode is electrically connected to the semiconductor layer;

forming a second insulating film covering an edge portion of the anode;

forming a layer containing an organic compound over the anode;

forming a cathode over the layer containing the organic compound; and sealing the light emitting element by attaching a second substrate to the first substrate with a sealant so that the sealant is in contact with the taper portion.

12. A method for manufacturing a light emitting device, according to claim 11, wherein the first insulating film is formed by application.

13. A method for manufacturing a light emitting device, according to claim 11, wherein the second insulating film is a SiOx film including an alkyl group formed by application.

14. A method for manufacturing a light emitting device, according to claim 11, wherein the anode is formed by sputtering using a target made of indium tin oxide containing SiOx.

15. A method for manufacturing a light emitting device comprising the steps of:

forming a thin film transistor including a semiconductor layer having a source region, a drain region, and a channel formation region therebetween, a gate insulating film, and a gate electrode over a first substrate having an insulating surface;

forming a highly thermostable planarizing film over an uneven shape reflected by the thin film transistor;

forming an opening portion which has a tapered shape on a side face and is located over the source region or the drain region and a peripheral portion which has a tapered shape by selectively removing the highly thermostable planarizing film;

forming a contact hole which reaches the source region or the drain region by selectively removing the gate insulating film;

forming an electrode which reaches the source region or the drain region;

forming an anode containing SiOx which is in contact with the electrode;

forming a bank covering an edge portion of the anode;

forming a layer containing an organic compound over the anode;

forming a cathode over the layer containing the organic compound; and attaching a second substrate to the first substrate with a sealant, wherein the bank is a SiOx film including an alkyl group formed by application.

16. A method for manufacturing a light emitting device, according to claim 15, wherein the anode is formed by sputtering using a target made of indium tin oxide containing SiOx.

* * * * *